（12） United States Patent
Yamamoto et al.

(10) Patent No.: US 11,581,944 B2
(45) Date of Patent: Feb. 14, 2023

(54) OPTICAL TRANSMISSION SYSTEM

(71) Applicant: NIPPON TELEGRAPH AND TELEPHONE CORPORATION, Tokyo (JP)

(72) Inventors: Shuto Yamamoto, Musashino (JP); Seiji Okamoto, Musashino (JP); Akira Masuda, Musashino (JP); Hiroki Taniguchi, Musashino (JP); Yoshiaki Kisaka, Musashino (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 0 days.

(21) Appl. No.: 17/291,170

(22) PCT Filed: Nov. 7, 2019

(86) PCT No.: PCT/JP2019/043650
§ 371 (c)(1),
(2) Date: May 4, 2021

(87) PCT Pub. No.: WO2020/095986
PCT Pub. Date: May 14, 2020

(65) Prior Publication Data
US 2021/0367670 A1 Nov. 25, 2021

(30) Foreign Application Priority Data
Nov. 8, 2018 (JP) .............................. JP2018-210832

(51) Int. Cl.
H04B 10/2507 (2013.01)
H03M 13/41 (2006.01)
(Continued)

(52) U.S. Cl.
CPC ........ H04B 10/2507 (2013.01); H03M 13/41 (2013.01); H04B 10/516 (2013.01); H04B 10/61 (2013.01); H04L 25/49 (2013.01)

(58) Field of Classification Search
None
See application file for complete search history.

(56) References Cited

U.S. PATENT DOCUMENTS

2014/0376925 A1    12/2014  Koike-Akino et al.
2016/0226625 A1*    8/2016  Millar .............. H04B 10/5561
2021/0281450 A1*    9/2021  Binkai ............. H04B 10/5161

FOREIGN PATENT DOCUMENTS

JP      2016521465 A     7/2016
WO  WO-2018167920 A1 *  9/2018  ......... H04B 10/5161

OTHER PUBLICATIONS

Seiji Okamoto et al., Experimental and Numerical Comparison of Probabilistically-Shaped 4096 QAM and Uniformly-Shaped 1024 QAM in All-Raman Amplified 160 km Transmission, OFC 2018, 2018.

* cited by examiner

Primary Examiner — David W Lambert
(74) Attorney, Agent, or Firm — Harness, Dickey & Pierce, P.L.C.

(57) ABSTRACT

An optical transmission system including an optical transmitter and an optical receiver, wherein the optical transmitter includes a signal coding unit that performs non-linear block coding on an M (M is an integer greater than or equal to 1)-value symbol sequence or a bit sequence input as data information to generate an L (L is an integer greater than or equal to 2, L>M)-value symbol sequence that corresponds to the M-value symbol sequence or the bit sequence in one-to-one correspondence, a digital-to-analog conversion unit that converts the generated L-value symbol sequence to an
(Continued)

analog signal, and a modulator that generates an optical modulation signal by performing modulation based on the analog signal, and the optical receiver includes a light receiving unit that receives the optical modulation signal transmitted from the optical transmitter and converts the optical modulation signal to an electrical signal, and a signal decoding unit that restores the M-value symbol sequence or the bit sequence by performing processing that is the reverse of processing performed by the signal coding unit, on the electrical signal.

8 Claims, 22 Drawing Sheets

(51) Int. Cl.
    *H04B 10/516*     (2013.01)
    *H04B 10/61*     (2013.01)
    *H04L 25/49*     (2006.01)

OPTICAL TRANSMISSION SYSTEM

CROSS-REFERENCE TO RELATED APPLICATIONS

This application is a 371 U.S. National Phase of International Application No. PCT/JP2019/043650 filed on Nov. 7, 2019, which claims priority to Japanese Application No. 2018-210832 filed on Nov. 8, 2018. The entire disclosures of the above applications are incorporated herein by reference.

TECHNICAL FIELD

The present invention relates to an optical transmission system.

BACKGROUND ART

Following increasing demand for data communication, optical transmission networks in which optical signal modulation technologies and optical signal multiplexing technologies that enable transmission of a large amount of traffic are used are becoming popular. In particular, in ultrahigh speed optical transmission systems in which the transmission speed per wave is 100 Gbit/sec (hereinafter denoted as "Gb/s") or higher, a digital coherent technology, which is a combination of coherent detection and a digital signal processing technology, is widely used. On the other hand, with the popularization of high volume data communication represented by LTE (Long Term Evolution) in mobile terminals, there is demand for realizing ultrahigh speed optical transmission as fast as 100 Gb/s at a lower cost, that is, with a simpler device configuration for transmission and reception, when compared to that required by the above-described digital coherent technology.

As methods for realizing ultrahigh speed optical transmission as fast as 100 Gb/s with a simple device configuration, direct detection methods in which a data signal is demodulated based on intensity information regarding an optical signal are attracting attention. In particular, studies are carried out on an ultrahigh speed optical transmission method that uses PAM4 (4-level Pulse Amplitude Modulation), which is a four-value intensity modulation method having higher efficiency of use of frequencies when compared to a NRZ (Non Return-to-Zero) method, which is a binary intensity modulation signal.

In optical transmission as fast as 100 Gb/s that is performed using a digital coherent technology, a modulation method of polarization division multiplexing QPSK (Quadrature Phase Shift Keying) (hereinafter referred to as "PDM-QPSK" (Polarization Division Multiplexing-QPSK)) is commonly used. If PDM-QPSK is used, the modulation rate is about 25 GBd (Giga Baud). On the other hand, if ultrahigh speed optical transmission as fast as 100 Gb/s is performed using the modulation method of PAM4, the modulation rate is about 50 GBd. Accordingly, if PAM4 is used, a signal spectrum occupies a frequency range that is wider than that occupied when the PDM-QPSK method is used.

A wide frequency range being occupied means that if the modulation method of PAM4 is applied to realize ultrahigh speed optical transmission as fast as 100 Gb/s, the optical transmission is largely affected by waveform deterioration due to band limitation of an electrical device, when compared to a case in which the PDM-QPSK method is used. Also, in direct detection methods, it is not possible to compensate for waveform deterioration due to wavelength dispersion involved in transmission fibers through digital signal processing, and therefore deterioration in signal quality due to wavelength dispersion is also a major problem when the PAM4 method is applied. Deterioration in signal quality due to wavelength dispersion is proportional to the square of the modulation rate, and accordingly, deterioration in signal quality due to wavelength dispersion is significant particularly in the case of a signal that is modulated to light speed of 50 Gbaud or higher.

CITATION LIST

Non Patent Literature

[NPL 1] Seiji Okamoto, Masaki Terayama, Masato Yoshida, Keisuke Kasai, Toshihiko Hirooka, and Masataka Nakazawa, "Experimental and Numerical Comparison of Probabilistically-Shaped 4096 QAM and Uniformly-Shaped 1024 QAM in All-Raman Amplified 160 km Transmission", OFC 2018, M3C.5

SUMMARY OF THE INVENTION

Technical Problem

As described above, deterioration in signal quality due to band limitation of an electro-optical device and deterioration in signal quality due to wavelength dispersion involved in optical fiber transmission paths are issues in realizing ultrahigh speed optical transmission as fast as 100 Gb/s by using the PAM4 method.

Conventionally, a coding method that is called probabilistic shaping has been proposed as a method for improving optical signal reception sensitivity (for example, see NPL 1). However, the method described in NPL 1 aims to improve reception sensitivity in a Gaussian noise environment, and therefore cannot be applied to a method for improving reception sensitivity in an environment in which inter-symbol interference due to frequency response occurs, like circumstances where there are band limitation and wavelength dispersion. Therefore, there is a problem in that deterioration in signal quality cannot be suppressed.

In view of the above circumstances, it is an object of the present invention to provide a technology that can suppress deterioration in signal quality.

Means for Solving the Problem

One aspect of the present invention is an optical transmission system that includes an optical transmitter and an optical receiver, wherein the optical transmitter includes a signal coding unit that performs non-linear block coding on an M (M is an integer greater than or equal to 1)-value symbol sequence or a bit sequence input as data information to generate an L (L is an integer greater than or equal to 2, L>M)-value symbol sequence that corresponds to the M-value symbol sequence or the bit sequence in one-to-one correspondence, a digital-to-analog conversion unit that converts the generated L-value symbol sequence to an analog signal, and a modulator that generates an optical modulation signal by performing modulation based on the analog signal, and the optical receiver includes a light receiving unit that receives the optical modulation signal transmitted from the optical transmitter and converts the optical modulation signal to an electrical signal, and a signal decoding unit that restores the M-value symbol sequence or the bit sequence by performing processing that is the reverse of processing performed by the signal coding unit, on the electrical signal.

One aspect of the present invention is the optical transmission system, wherein if an M-value symbol sequence that is constituted by N (N is an integer greater than or equal to 1) symbols is input as the data information, the signal coding unit assigns L-value symbol sequences to $M^N$ M-value symbol sequences in ascending order of a cost value, out of $L^{(N+P)}$ (P is an integer greater than or equal to 0) L-value symbol sequences that are all or some of possible L-value symbol sequences.

One aspect of the present invention is the optical transmission system, wherein with respect to each of the $L^{(N+P)}$ L-value symbol sequences, the signal coding unit performs discrete Fourier transformation to acquire a signal spectrum of the L-value symbol sequence, and calculates, as the cost value, a signal spectrum breadth $\sigma^2$ based on the acquired signal spectrum by using Expression 1 shown below.

One aspect of the present invention is the optical transmission system, wherein if an M-value symbol sequence that is constituted by N (N is an integer greater than or equal to 1) symbols is input as the data information, the signal coding unit assigns L-value symbol sequences to $M^N$ M-value symbol sequences in ascending order of a cost value, out of $L^{(N+P)}$ (P is an integer greater than or equal to 0) L-value symbol sequences that are all or some of possible L-value symbol sequences, the cost value being a signal spectrum breadth $\sigma^2$ that is calculated by using Expressions 2 and 3 shown below.

One aspect of the present invention is the optical transmission system, wherein if a bit sequence of which one block is constituted by J (J is an integer greater than or equal to 1) bits is input as the data information, the signal coding unit extracts $2^J$ L-value symbol sequences out of $L^N$ (N is an integer greater than or equal to 1) L-value symbol sequences in ascending order of a cost value, and assigns each of the extracted L-value symbol sequences to J bits in one-to-one correspondence.

One aspect of the present invention is the optical transmission system, wherein the optical transmitter further includes an error correction coding unit that performs error correction coding after non-linear block coding, and the optical receiver further includes an error correction decoding unit that performs error correction decoding before non-linear block decoding.

One aspect of the present invention is the optical transmission system, wherein the optical receiver performs determination based on maximum likelihood sequence estimation in signal demodulation that is performed with respect to an L-value symbol sequence.

One aspect of the present invention is the optical transmission system, wherein the signal coding unit is constituted by: a plurality of scrambler units that generate K different types of L-value symbol sequences by converting the M-value symbol sequence to L-value symbol sequences that are each constituted by N+P−1 L-value symbols; a plurality of scrambler number giving units that give symbols indicating scrambler numbers to the K types of L-value symbol sequences; a plurality of cost value calculation units that calculate a cost value with respect to each of the L-value symbol sequences; and a sequence selection unit that selects an L-value symbol sequence that has the smallest cost value from among the K types of L-value symbol sequences, and the signal decoding unit is constituted by: a plurality of scrambler number removing units that remove a symbol indicating a scrambler number from the L-value symbol sequence; and a plurality of descramblers that restore an M-value symbol sequence that is a symbol sequence before coding by executing decoding processing using a descrambler according to the scrambler number, the decoding processing corresponding to reverse conversion of coding processing performed by the scrambler units.

Effects of the Invention

According to the present invention, it is possible to suppress deterioration in signal quality.

DESCRIPTION OF EMBODIMENTS

Figure 1:
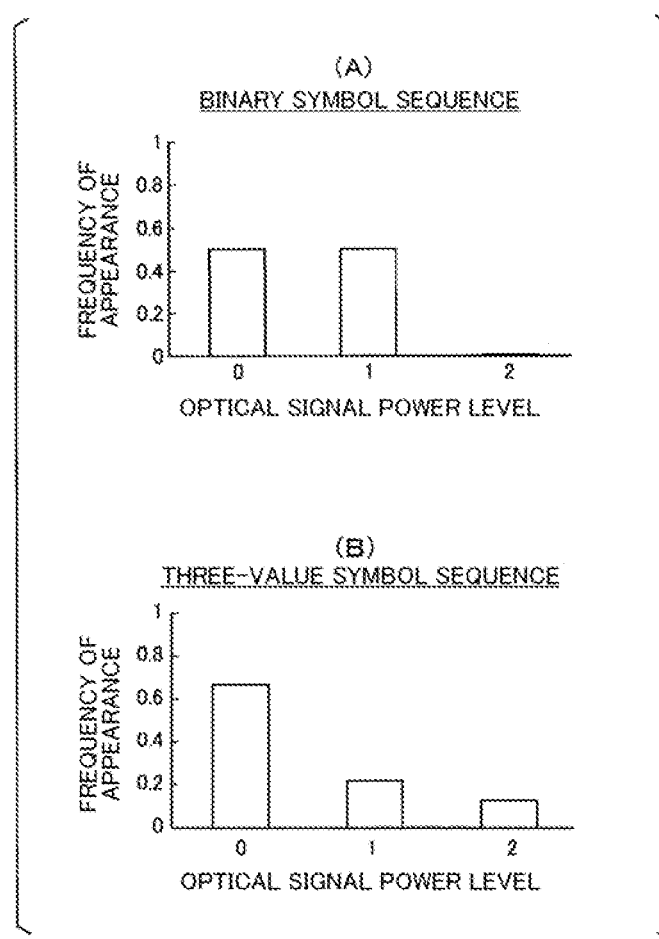
FIG. 1 is a diagram showing a relationship between an optical signal power level and a frequency of appearance in the cases of a usual binary symbol sequence and a three-value symbol sequence.

The following describes one embodiment of the present invention with reference to the drawings.

(Overview)

First, an overview of the present invention will be described in comparison with a conventional technology.

Conventional probabilistic shaping is a method for improving reception sensitivity by reducing an average power of optical signals while maintaining distances between constellation points by applying non-linear coding to blocks that are each constituted by N (N is an integer greater than or equal to 1) symbols. Specifically, in the conventional probabilistic shaping, an M (M is an integer greater than or equal to 1)-value symbol sequence that is constituted by N M-value symbols is converted to an L (L is an integer greater than or equal to 2)-value symbol sequence that is constituted by N L-value symbols, in one-to-one correspondence. Note that in the following description, assume that L>M.

At this time, $M^N$ types of L-value symbol sequences are extracted out of L-value symbol sequences that are each constituted by N L-value symbols in ascending order of the power of the L-value symbol sequences.

In the probabilistic shaping, symbol sequences having a smaller average power can be generated by associating the extracted $M^N$ types of L-value symbol sequences with all patterns (a total of $M^N$ types) of M-value symbol sequences each constituted by N M-value symbols. If signals are transmitted using the symbol sequences, it is possible to reduce an average power of optical signals while maintaining distances between constellation points, and reception sensitivity can be consequently improved. For example, assume a case in which N=3, M=2, and L=3. The following lists all binary symbol sequences of eight types.

(Binary Symbol Sequences)
000
001
010
011
100
101
110
111

On the other hand, the following lists all three-value symbol sequences of 27 types.

(Three-Value Symbol Sequences)
000
001
002
010
011
012
020
021
022
100
101
102
110
111
112
120
121
122
200
201
202
210
211
212
220
221
222

In the probabilistic shaping, it is necessary to assign eight types of three-value symbol sequences to the total of eight types of binary symbol sequences in one-to-one correspondence. At this time, if coding is performed by preferentially assigning three-value symbol sequences having small signal powers to the binary symbol sequences, it is possible to reduce an average power of coded three-value symbol sequences. For example, it is possible to generate three-value symbol sequences having a small average power by assigning three-value symbol sequences to the total of eight types of binary symbol sequences as follows.

000→000
001→001
010→010
011→011
100→100
101→002
110→020
111→200

In the usual binary symbol sequences, the probability of the occurrence of a symbol 0 is 1/2 and the probability of the occurrence of a symbol 1 is also 1/2. On the other hand, in the three-value symbol sequences generated through the above conversion, the probability of the occurrence of the symbol 0 is 16/24, the probability of the occurrence of the symbol 1 is 5/24, and the probability of the occurrence of a symbol 2 is 3/24.

Accordingly, when optical transmission signals are transmitted by associating the value of each symbol with light intensity, optical signals corresponding to the usual binary symbol sequences have an average power of 1/2 (=1/2×0+1/2×1). On the other hand, optical signals corresponding to the three-value symbol sequences have an average power of 11/24 (=16/24×0+5/24×1+3/24×2), which is smaller than the average power of the usual binary symbol sequences. At this time, the amount of information that can be transmitted using these eight types of three-value symbol sequences is 3 bit (=$2^3$), which is the same as the amount of information transmitted using the usual binary symbol sequences.

Therefore, by using the probabilistic shaping, a user can reduce the signal power while maintaining distances between constellation points, without reducing the amount of information that can be transmitted. In other words, if the above-described three-value symbol sequences are transmitted with the same average power as the usual binary symbol sequences, distances between constellation points can be made longer than those of the usual binary symbol sequences. Therefore, resistance to white noise is increased and reception sensitivity can be consequently improved.

FIG. 1 is a diagram showing a relationship between an optical signal power level and a frequency of appearance in the cases of a usual binary symbol sequence and a three-value symbol sequence. FIG. 1(A) shows the relationship between the optical signal power level and the frequency of appearance in the case of a usual binary symbol sequence and FIG. 1(B) shows the relationship between the optical signal power level and the frequency of appearance in the case of a three-value symbol sequence. In FIG. 1, the horizontal axis indicates the optical signal power level and the vertical axis indicates the frequency of appearance.

As shown in FIGS. 1(A) and 1(B), frequencies of appearance of optical signal power levels differ between the binary symbol sequence and the three-value symbol sequence.

In the conventional method, three-value symbol sequences having small signal powers are assigned to binary symbol sequences. In contrast, in a method according to the present invention, coding is performed by preferentially assigning three-value symbol sequences that have small signal fluctuation, that is, narrower signal spectra to binary symbol sequences. As a result, with the method according to the present invention, it is possible to narrow signal spectrum bandwidths of coded three-value symbol sequences.

The following describes specific embodiments.

First Embodiment

Figure 2:
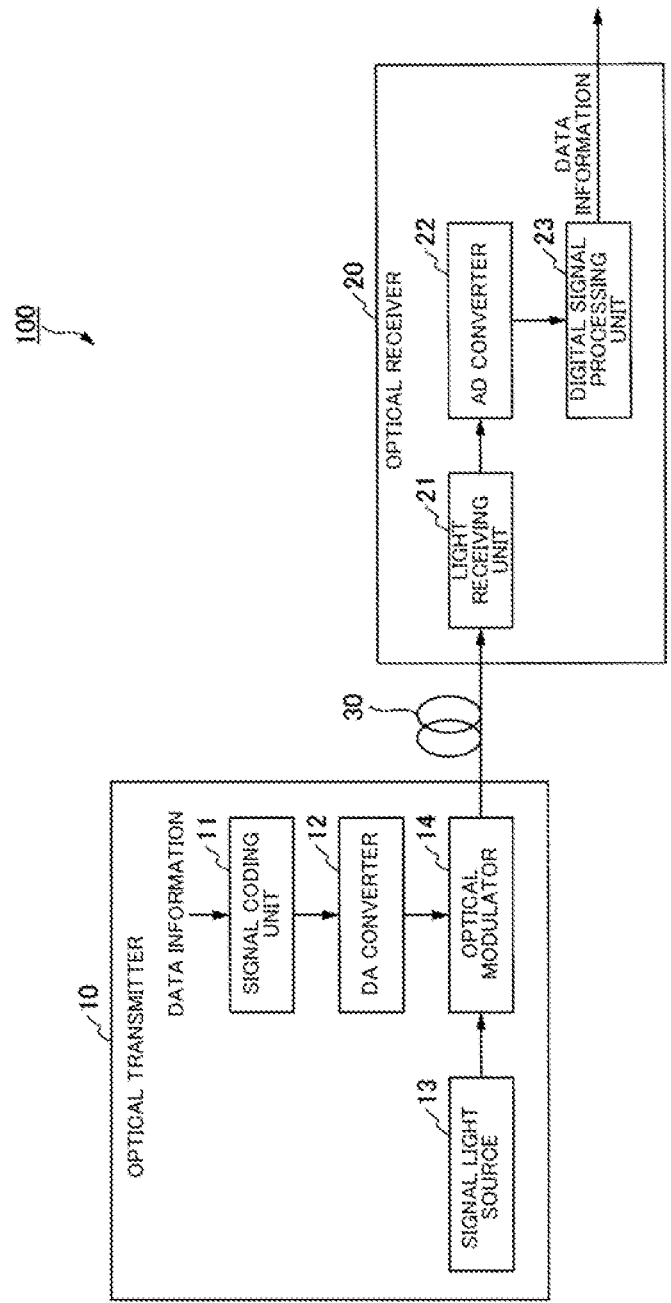
FIG. 2 is a diagram showing a system configuration of an optical transmission system in a first embodiment.

FIG. 2 is a diagram showing a system configuration of an optical transmission system 100 in a first embodiment. The optical transmission system 100 includes an optical transmitter 10 and an optical receiver 20. The optical transmitter 10 and the optical receiver 20 are connected to each other via an optical fiber 30. The optical fiber 30 is a transmission path that connects the optical transmitter 10 and the optical receiver 20.

The optical transmitter 10 includes a signal coding unit 11, a DA converter 12, a signal light source 13, and an optical modulator 14. Here, data information that is input to the optical transmitter 10 is M-value symbols before coding.

The signal coding unit 11 converts an M-value symbol sequence that is data information to an L-value symbol sequence.

The signal coding unit 11 performs coding by preferentially assigning L-value symbol sequences that have small signal fluctuation to M-value symbol sequences. As a result, an L-value symbol sequence having a narrowed signal spectrum bandwidth can be generated.

The DA converter 12 converts a digital signal of the L-value symbol sequence generated by the signal coding unit 11 to an analog signal. The DA converter 12 applies the analog signal to the optical modulator 14.

The signal light source 13 emits continuous light to the optical modulator 14.

The optical modulator 14 generates an L-value optical modulation signal by modulating the continuous light emitted from the signal light source 13 using the analog signal applied by the DA converter 12. The optical modulator 14 transmits the generated L-value optical modulation signal via the optical fiber 30 to the optical receiver 20.

Note that the signal light source 13 and the optical modulator 14 do not necessarily have to be separate, and the optical modulator 14 may also generate the L-value optical modulation signal by directly modulating the continuous light emitted from the signal light source 13.

The optical receiver 20 includes a light receiving unit 21, an AD converter 22, and a digital signal processing unit 23.

The light receiving unit 21 performs direct wave detection on the L-value optical modulation signal transmitted from the optical transmitter 10 and acquires light intensity information regarding the L-value optical modulation signal. The light receiving unit 21 converts the acquired light intensity information to an analog electrical signal and outputs the analog electrical signal to the AD converter 22.

The AD converter 22 converts the analog electrical signal output from the light receiving unit 21 to a digital signal.

The digital signal processing unit 23 acquires M-value symbols before coding by processing the digital signal.

Figure 3:
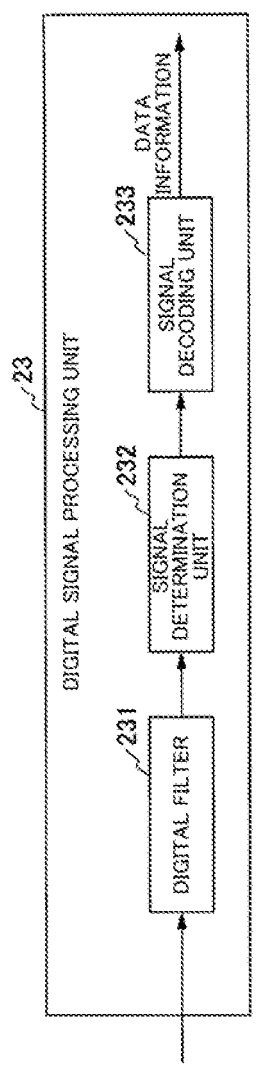
FIG. 3 is a diagram showing an internal configuration of a digital signal processing unit in the first embodiment.

FIG. 3 is a diagram showing an internal configuration of the digital signal processing unit 23 in the first embodiment.

The digital signal processing unit 23 includes a digital filter 231, a signal determination unit 232, and a signal decoding unit 233.

The digital filter 231 performs waveform shaping on the L-value optical modulation signal. The digital filter 231 outputs the waveform-shaped L-value optical modulation signal to the signal determination unit 232. A FIR (Finite Impulse Response) filter, which is a commonly used linear filter, a Volterra filter, which can describe a high-order transfer function, or the like is used as the digital filter 231.

The signal determination unit 232 performs symbol determination with respect to the waveform-shaped L-value optical modulation signal to acquire an L-value symbol sequence. The signal determination unit 232 outputs the acquired L-value symbol sequence to the signal decoding unit 233.

The signal decoding unit 233 restores the M-value symbol sequence based on correspondence between the L-value symbol sequence output from the signal determination unit 232 and the M-value symbol sequence. A correspondence table that shows correspondence between the L-value symbol sequence and the M-value symbol sequence may be transmitted from the optical transmitter 10 to the optical receiver 20 in advance or may also be transmitted from the optical transmitter 10 together with the modulation signal.

The optical transmission system 100 configured as described above performs coding by converting M-value symbol sequences to L-value symbol sequences, where L being larger than M, extracting only patterns that have small signal fluctuation out of the converted L-value symbol sequences, and assigning the extracted L-value symbol sequences to M-value symbol sequences in one-to-one correspondence. Thus, the optical transmission system 100 can generate L-value symbol sequences having narrowed signal spectrum bandwidths. Therefore, even under conditions where there is band limitation, deterioration in signal quality can be suppressed and high-quality transmission can be realized.

Second Embodiment

In a second embodiment, L-value symbol sequences having small signal fluctuation are preferentially assigned to M-value symbol sequences in the signal coding unit 11 as described below. In the following description, the number of symbols that constitute each M-value symbol sequence is represented by N and the number of symbols that constitute each L-value symbol sequence is represented by N+P (P is an integer greater than or equal to 0). Note that configurations of the optical transmitter 10 and the optical receiver 20 in the second embodiment are the same as those in the first embodiment.

The signal coding unit 11 preferentially assigns L-value symbol sequences having small signal fluctuation to M-value symbol sequences by performing the following steps 1 to 6.

Step 1
The signal coding unit 11 lists all L-value symbol sequences each constituted by N+P symbols. Thus, $L^{(N+P)}$ L-value symbol sequences are obtained.

Step 2
The signal coding unit 11 performs discrete Fourier transformation with respect to each of the $L^{(N+P)}$ L-value symbol sequences to obtain the signal spectrum of each L-value symbol sequence.

Step 3
The signal coding unit 11 calculates the breadth of the signal spectrum of each L-value symbol sequence. Specifically, the signal coding unit 11 obtains a signal spectrum breadth $\sigma^2$ by performing calculation expressed by the following Expression 1 with respect to an N+P numerical value sequence (F1, F2, ..., $F_{(N+P)}$) obtained by performing discrete Fourier transformation on an L-value symbol sequence constituted by (N+P) symbols.

$\sigma^2$ is taken to be a cost value. Here, [ ] is a Gauss symbol.

[Formula 1]

$$\sigma^2 = \sum_{n=1}^{[(N+P)/2]} |F_n|^2 (n-1)^2 + \frac{1}{2}\left|F_{\left[\frac{(N+P)}{2}+1\right]}\right|^2 \left[\frac{(N+P)}{2}\right]^2 \quad \text{Expression 1}$$

Step 4
The signal coding unit 11 assigns L-value symbol sequences to M-value symbol sequences in ascending order of the cost value. At this time, if only L-value symbol sequences in which the value of the first symbol or the last symbol is [(L−1)/2] are assigned to M-value symbol sequences, it is possible to suppress fluctuation at a high frequency on borders between symbol sequences that are continuous in time.

Step 5
The signal coding unit 11 creates a correspondence table that shows correspondence between M-value symbol sequences corresponding to signals before coding and L-value symbol sequences corresponding to coded signals, based on the result of assignment performed in step 4.

Step 6
The signal coding unit 11 converts an M-value symbol sequence to an L-value symbol sequence based on the correspondence table. Thus, the signal coding unit 11 codes the M-value symbol sequence.

In the signal decoding unit 233 of the optical receiver 20, the L-value symbol sequence is decoded to the M-value symbol sequence based on the correspondence table created as described above. The following shows a specific example of the correspondence table. In the following example, N=8, M=2, L=3, and P=0. The following 256 three-value symbol sequences are assigned to $2^8$ (256) binary symbol sequences 00000000 to 11111111. Note that the following only lists three-value symbol sequences in which the first symbol is 1.

11111111
11000000
11111100
10000001
11111001
11110011
11100111
11001111
10011111
12211111
11221111
11122111
11112211
11111221
12222221
11111122
11222222
11110000
11100001
11000011
10000111
12222111
11222211
11122221
11112222
11100000
11110001
10000011
11000111
11222111
12222211
11112221
11122222
11111000
11000001
11100011
10001111
12221111
11122211
11222221
11111222
10000000
11111110
11111101
11111011
11110111
11101111
11011111
10111111
12111111
11211111
11121111
11112111
11111211
11111121
11111112
12222222
12210000
12222100
10000122
10012222
12221000
10001222
12211100
11221001
11001221
10011122
12100000
11122100
12222210
12210011
10012211
10000012
11100012
10122222
11001100
10011001

12211221
11221122
11210001
11222101
11000121
11012221
12111000
11121000
12221110
11122210
12100011
12221011
10001211
10122211
11100012
10001112
11101222
10111222
11222100
12210001
10012221
11000122
12211000
11221000
12221100
12221001
10001221
10001122
11001222
10011222
11221100
12211001
10011221
11001122
12111100
11112100
12211110
11112210
11121001
11122101
11210011
11221011
12100111
12210111
10012111
10122111
11001211
11012211
11100121
11101221
11110012
10011112
11110122
10111122
11011000
11100100
10011100
11000110
12111110
11111210
10110001
11001001
10001101
11112101
10010011
11121011
11210111

12101111
10121111
11012111
11101211
12212211
11110121
12221121
11221221
12112221
11111012
10111112
11222112
12211122
11122122
11211222
12110000
11210000
12222110
11222210
12100001
12222101
10000121
10122221
11000012
10000112
11012222
10112222
11001000
10011000
11000100
10001100
11101100
11011100
11100110
11001110
10010001
10001001
11011001
10111001
11001101
10011101
10110011
10011011
12211211
12112211
12211121
11221121
12111221
11211221
12221221
12212221
11221112
11122112
11211122
11121122
12221122
11222122
12211222
11221222
10010000
10000100
11110110
11011110
11101101
10111101
11011011
10110111

12112111
11211211
12111121
11121121
11211112
11112112
12222122
12212222
11211100
11121100
11221110
11122110
12111001
11211001
12211101
11221101
12110011
12211011
10011211
10112211
11001121
10011121
11011221
10111221
11100112
11001112
11101122
11011122
11121110
11211101
12111011
10111211
11011121
11101112
11010000
10110000
11110100
10111100
11000010
11110010
10000110
10011110
10100001
11101001
10000101

Figure 4:
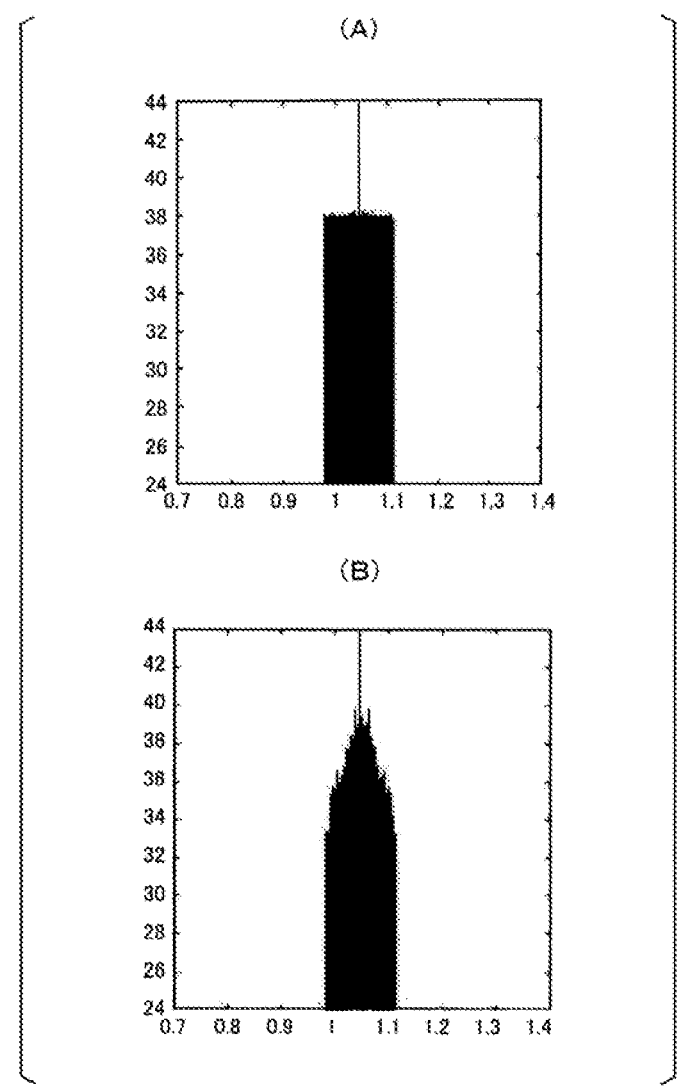
FIG. 4 is a diagram showing a signal spectrum of binary symbols before coding and a signal spectrum of coded three-value symbols obtained through non-linear coding in the present invention.

FIG. 4 is a diagram showing a signal spectrum of binary symbols before coding and a signal spectrum of coded three-value symbols obtained through non-linear coding in the present invention. FIG. 4(A) shows the signal spectrum of binary symbols before coding. FIG. 4(B) shows the signal spectrum of coded three-value symbols obtained through non-linear coding in the present invention. In FIG. 4, the horizontal axis indicates the frequency and the vertical axis indicates the signal power. Note that here, a pseudo random pattern with a degree of 15 is taken to be the binary symbols before coding.

Also, in FIG. 4, a raised cosine filter having a roll-off factor of 0.01 is applied to the symbol sequences. As shown in FIG. 4(B), in the case of the coded symbol sequence, the generation of high-frequency components is suppressed and the signal power is concentrated in a low-frequency region. That is, the signal spectrum bandwidth is narrowed. As a result of the signal spectrum bandwidth being narrowed, the influence of waveform deterioration due to band limitation and wavelength dispersion inherent in the optical transmission system is reduced.

Figure 5:
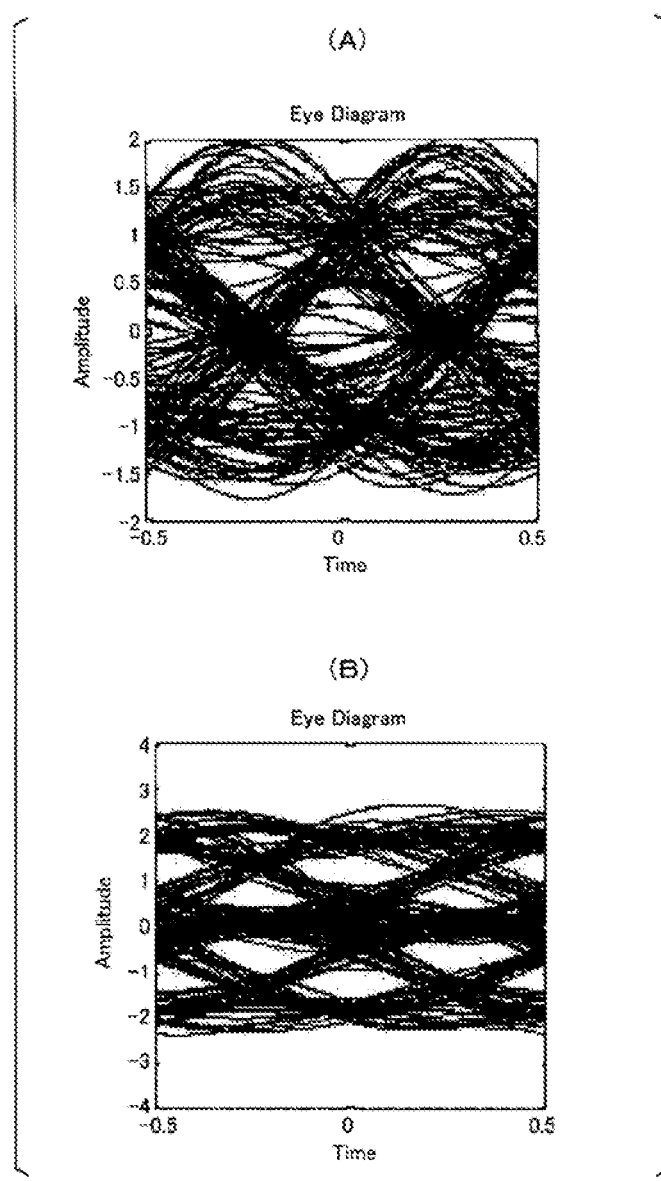
FIG. 5 is a diagram showing eye patterns of received signals transmitted under circumstances where there are a band limitation of 10 GHz and wavelength dispersion of −64 ps/nm.

FIG. 5 is a diagram showing eye patterns of received signals transmitted under circumstances where there are a band limitation of 10 GHz and wavelength dispersion of −64 ps/nm. FIG. 5(A) shows an eye pattern corresponding to FIG. 4(A) and FIG. 5(B) shows an eye pattern corresponding to FIG. 4(B). In FIG. 5, the modulation rate of the signals is 56 GBd and waveform deterioration compensation performed using a FIR (Finite Impulse Response) filter with 11 taps is applied to the received signals.

As shown in FIG. 5(A), in the case of the binary symbol sequence before coding, eye openings are significantly deteriorated under the influence of band limitation and wavelength dispersion, and binary symbols are difficult to identify.

In contrast, as shown in FIG. 5(B), in the case of the coded three-value symbol sequence, eye openings are not significantly deteriorated even under the circumstances where there are a considerable band limitation and wavelength dispersion, and three-value symbols can be easily identified. That is, if non-linear coding in the present invention is applied, an optical signal can be improved in terms of resistance to band limitation and resistance to wavelength dispersion. This can be confirmed from FIG. 5(B).

Figure 6:
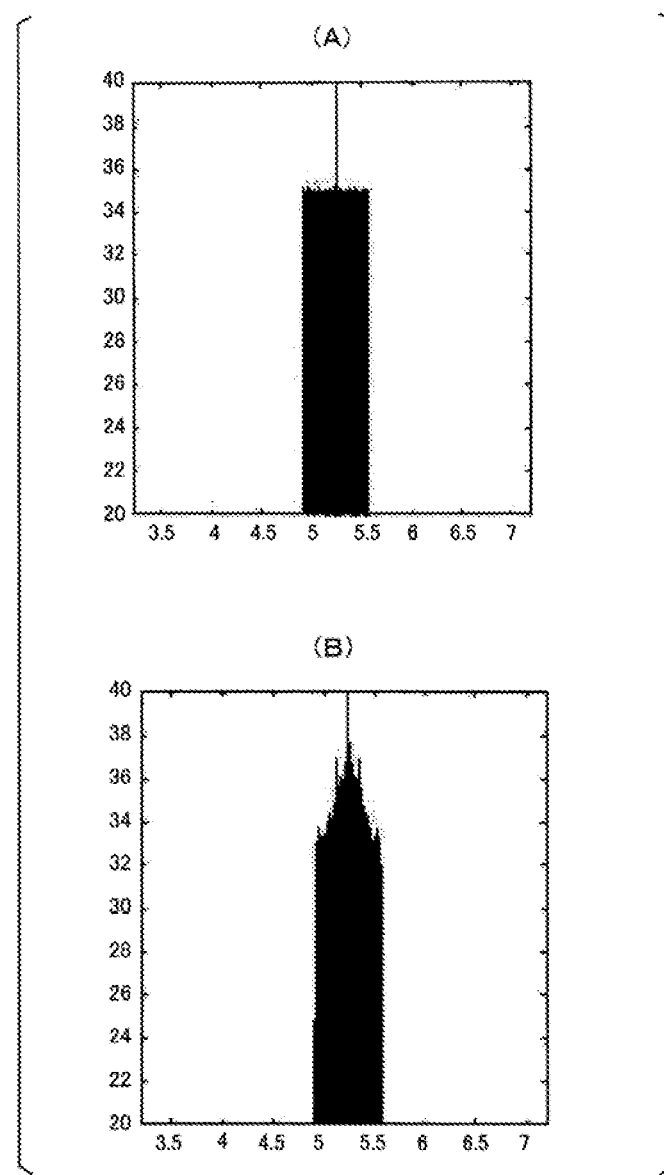
FIG. 6 is a diagram showing a signal spectrum of four-value symbols before coding and a signal spectrum of coded five-value symbols obtained through non-linear coding in the present invention.

FIG. 6 is a diagram showing a signal spectrum of four-value symbols before coding and a signal spectrum of coded five-value symbols obtained through non-linear coding in the present invention. FIG. 6(A) shows the signal spectrum of four-value symbols before coding. FIG. 6(B) shows the signal spectrum of coded five-value symbols obtained through non-linear coding in the present invention. In FIG. 6, the horizontal axis indicates the frequency and the vertical axis indicates the signal power. Here, no limitation is imposed on the first symbol and the last symbol of the coded four-value symbol sequence.

As shown in FIG. 6(B), in the case of the coded symbol sequence, the generation of high-frequency components is suppressed and the signal power is concentrated in a low-frequency region. That is, the signal spectrum bandwidth is narrowed. As a result of the signal spectrum bandwidth being narrowed, the influence of waveform deterioration due to band limitation and wavelength dispersion inherent in the optical transmission system is reduced.

Figure 7:
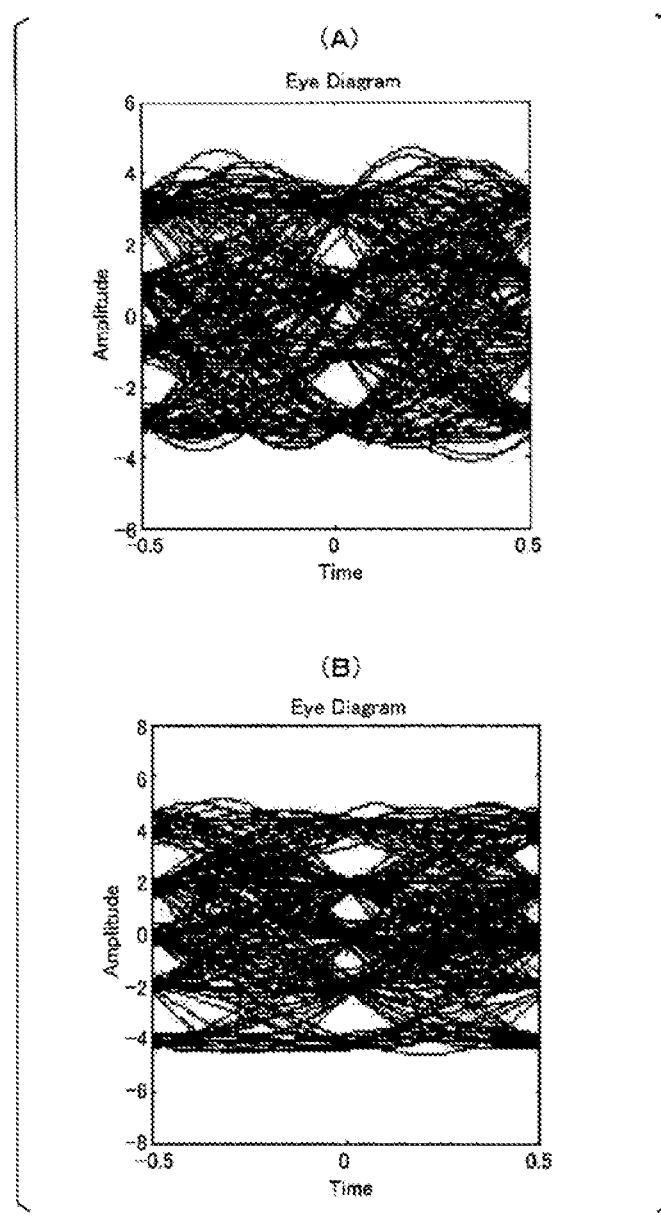
FIG. 7 is a diagram showing eye patterns of received signals transmitted under circumstances where there are a band limitation of 22 GHz and wavelength dispersion of −32 ps/nm.

FIG. 7 is a diagram showing eye patterns of received signals transmitted under circumstances where there are a band limitation of 22 GHz and wavelength dispersion of −32 ps/nm. FIG. 7(A) shows an eye pattern corresponding to FIG. 6(A). FIG. 7(B) shows an eye pattern corresponding to FIG. 6(B). In FIG. 7, the modulation rate of the signals is 56 GBd and waveform deterioration compensation performed using a FIR filter with 31 taps is applied to the received signals.

As shown in FIG. 7(A), in the case of the four-value symbol sequence before coding, eye openings are significantly deteriorated under the influence of band limitation and wavelength dispersion, and four-value symbols are difficult to identify.

In contrast, as shown in FIG. 7(B), in the case of the coded five-value symbol sequence, eye openings are not significantly deteriorated even under the circumstances where there are a considerable band limitation and wavelength dispersion, and five-value symbols can be easily identified. That is, if non-linear coding proposed in the present invention is applied, an optical signal can be improved in terms of resistance to band limitation and resistance to wavelength dispersion. This can be confirmed from FIG. 7(B).

Sensitivity deterioration resulting from coding in principle is determined by the ratio between M and L. That is, if the value of L/M is close to 1, sensitivity deterioration in principle is small enough to be ignored.

On the other hand, the number of candidates for L-value symbol sequences to be assigned to M-value symbol sequences is $L^{(N+P)}$, and as $(L^{(N+P)})/(M^N)$ is increased, the signal spectrum bandwidth can be more effectively narrowed. Accordingly, even if the value of L/M is close to 1, if N is set to a sufficiently large value, it is possible to narrow the signal spectrum bandwidth with sensitivity deterioration that is small enough to be ignored. For example, if M=16, L=17, N=128, and P=0, L/M is about 1.06 and $(L^N)/(M^N)$ is about 2345.

According to the optical transmission system 100 in the second embodiment configured as described above, the signal coding unit 11 of the optical transmitter 10 can select patterns that have small signal fluctuation from among L-value symbol sequences by performing coding processing in the above-described steps 1 to 6. Then, the signal coding unit 11 performs coding by assigning the selected L-value symbol sequences to M-value symbol sequences in one-to-one correspondence. Thus, the signal coding unit 11 can generate L-value symbol sequences having narrowed signal spectrum bandwidths. Therefore, even under conditions where there is band limitation, deterioration in signal quality can be suppressed and high-quality transmission can be realized.

Third Embodiment

In a third embodiment, coding is performed by using a cost function that differs from the cost function described in the second embodiment. The signal coding unit 11 obtains a signal spectrum breadth $\sigma^2$ by performing calculation expressed by the following Expressions 2 and 3 as the cost function in step 3 of the third embodiment without using a signal spectrum. $\sigma^2$ is taken to be a cost value. Here, an L-value symbol sequence constituted by N symbols is expressed as $(S1, S2, \ldots S_{(N+P)})$.

[Formula 2]

$$\sigma^2 = \sum_{n=3}^{N+P} |\Delta S_n - \Delta S_{n-1}|^2 \qquad \text{Expression 2}$$

[Formula 3]

$$\Delta S_n := S_n - S_{n-1} \qquad \text{Expression 3}$$

The thus obtained signal spectrum breadth $\sigma^2$ also has a characteristic of taking a large value in the case of a symbol sequence that has large signal fluctuation and taking a small value in the case of a symbol sequence that has small signal fluctuation. For example, when N=4 and P=0, $\sigma^2$=32 in the cases of three-value symbol sequences 0202 and 2020, which have large signal fluctuation. Likewise, $\sigma^2$=0 in the cases of three-value symbol sequences 0000, 1111, and 2222, which have small signal fluctuation.

Similarly to the second embodiment, a configuration is also possible in which the signal coding unit 11 only assigns L-value symbol sequences in which the value of the first symbol or the last symbol is $[(L-1)/2]$ to M-value symbol sequences to suppress fluctuation at a high frequency on borders between symbol sequences that are continuous in time.

According to the optical transmission system 100 in the third embodiment configured as described above, the signal coding unit 11 of the optical transmitter 10 performs coding processing by using a method different from that in the second embodiment. Specifically, the signal coding unit 11 calculates a cost value that indicates a signal spectrum breadth without using a signal spectrum. Then, the signal coding unit 11 selects L-value symbol sequences in ascending order of the cost value based on calculated cost values. Thus, the signal coding unit 11 can select patterns that have small signal fluctuation from among L-value symbol sequences. Then, the signal coding unit 11 performs coding by assigning the selected L-value symbol sequences to M-value symbol sequences in one-to-one correspondence. Thus, the optical transmitter 10 can generate L-value symbol sequences having narrowed signal spectrum bandwidths. Therefore, even under conditions where there is band limitation, deterioration in signal quality can be suppressed and high-quality transmission can be realized.

Furthermore, the signal coding unit 11 in the third embodiment performs coding in which signal spectra are not used. Therefore, the signal coding unit 11 need not perform discrete Fourier transformation with respect to each L-value symbol sequence. Therefore, step 2 in the second embodiment can be omitted. That is, processing can be reduced in the third embodiment, when compared to the second embodiment.

Fourth Embodiment

In the description of a fourth embodiment, a configuration in which the coding method in the second or the third embodiment is applied to a QAM signal will be described.

Figure 8:
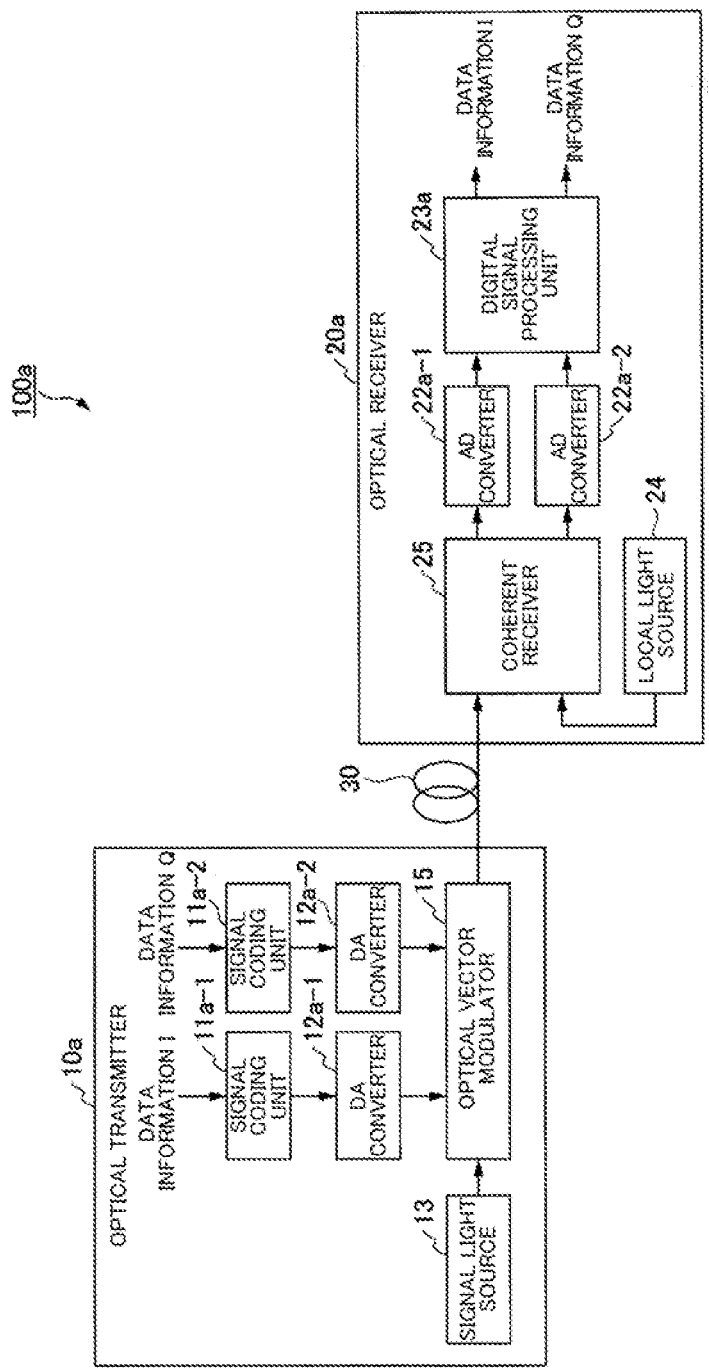
FIG. 8 is a diagram showing a system configuration of an optical transmission system in a fourth embodiment.

FIG. 8 is a diagram showing a system configuration of an optical transmission system 100a in the fourth embodiment. The optical transmission system 100a includes an optical transmitter 10a and an optical receiver 20a. The optical transmitter 10a and the optical receiver 20a are connected to each other via the optical fiber 30.

The optical transmitter 10a includes signal coding units 11a-1 and 11a-2, DA converters 12a-1 and 12a-2, the signal light source 13, and an optical vector modulator 15. In FIG. 8, the signal coding unit 11a-1 and the DA converter 12a-1 are functional units that process data information I. Also, the signal coding unit 11a-2 and the DA converter 12a-2 are functional units that process data information Q. Here, the data information I and the data information Q are M-value symbol sequences that are constituted by M-value symbols before coding and are independent from each other.

Note that in the following description, the signal coding units 11a-1 and 11a-2 will be referred to as signal coding units 11a when these units are not distinguished from each other. Also, in the following description, the DA converters 12a-1 and 12a-2 will be referred to as DA converters 12a when these converters are not distinguished from each other.

Data information I and data information Q that are to be transmitted are input from the outside to the signal coding units 11a, and the signal coding units 11a convert M-value symbol sequences corresponding to the input data information I and Q to L-value symbol sequences. Specifically, the signal coding unit 11a-1 converts an M-value symbol sequence corresponding to the input data information I to an L-value symbol sequence. The signal coding unit 11a-2 converts an M-value symbol sequence corresponding to the input data information Q to an L-value symbol sequence. The signal coding units 11a perform coding by preferentially assigning L-value symbol sequences that have small signal fluctuation to M-value symbol sequences. Thus, the signal coding units 11a can generate L-value symbol sequences having narrowed signal spectrum bandwidths.

The DA converters 12a convert digital signals of the L-value symbol sequences generated by the signal coding units 11a to analog signals. The DA converters 12a apply the analog signals to the optical vector modulator 15. Specifically, the DA converter 12a-1 converts a digital signal of the L-value symbol sequence generated by the signal coding unit 11a-1 to an analog signal. The DA converter 12a-1 applies the analog signal to the optical vector modulator 15. The DA converter 12a-2 converts a digital signal of the L-value symbol sequence generated by the signal coding unit 11a-2 to an analog signal. The DA converter 12a-2 applies the analog signal to the optical vector modulator 15.

The signal light source 13 emits continuous light to the optical vector modulator 15.

The optical vector modulator 15 independently performs amplitude modulation by using the analog signals that are output from the DA converters 12a-1 and 12a-2, respectively. Specifically, the optical vector modulator 15 modulates the continuous light emitted from the signal light source 13 using the analog signals to generate an $L^2$-QAM signal of which the I channel and the Q channel each have L values. The optical vector modulator 15 transmits the generated $L^2$-QAM signal via the optical fiber 30 to the optical receiver 20a.

The optical receiver 20a includes AD converters 22a-1 and 22a-2, a digital signal processing unit 23a, a local light source 24, and a coherent receiver 25.

The local light source 24 outputs local light that is to interfere with received signal light.

The coherent receiver 25 converts the $L^2$-QAM signal transmitted from the optical transmitter 10a to analog electrical signals by performing coherent detection on the $L^2$-QAM signal based on the local light.

The AD converters 22a convert the analog electrical signals output from the coherent receiver 25 to digital signals. Specifically, the AD converter 22a-1 converts an analog electrical signal of the I component to a digital signal. The AD converter 22a-2 converts an analog electrical signal of the Q component to a digital signal.

The digital signal processing unit 23a acquires M-value symbols before coding that correspond to the data information I and the data information Q by processing the digital signals.

Figure 9:
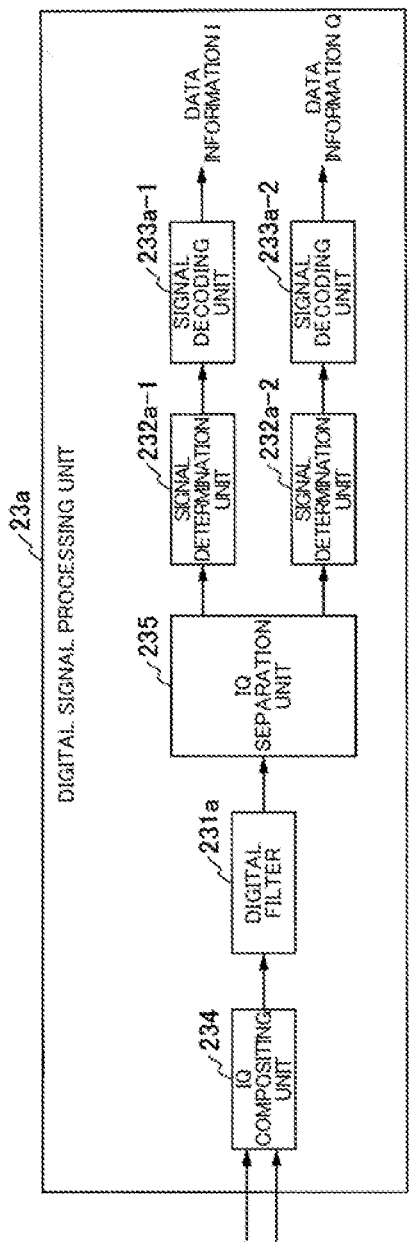
FIG. 9 is a diagram showing an internal configuration of a digital signal processing unit in the fourth embodiment.

FIG. 9 is a diagram showing an internal configuration of the digital signal processing unit 23a in the fourth embodiment.

The digital signal processing unit 23a includes a digital filter 231a, signal determination units 232a-1 and 232a-2, signal decoding units 233a-1 and 233a-2, an IQ compositing unit 234, and an IQ separation unit 235.

The IQ compositing unit 234 takes the digital signals output from the AD converters 22a-1 and 22a-2 as a real part (the digital signal of the I channel component) and an imaginary part (the digital signal of the Q channel component), respectively. The IQ compositing unit 234 generates a complex signal by compositing these signals. Specifically, the IQ compositing unit 234 takes the digital signal output from the AD converter 22a-1 as the real part, takes the digital signal output from the AD converter 22a-2 as the imaginary part, and composites these signals to generate the complex signal.

The digital filter 231a performs waveform shaping on the composite complex signal generated by the IQ compositing unit 234. The digital filter 231a outputs the waveform-shaped composite complex signal to the IQ separation unit 235.

The IQ separation unit 235 separates the signal output from the digital filter 231a into the real part (the digital signal of the I channel component) and the imaginary part (the digital signal of the Q channel component). The IQ separation unit 235 outputs the signal of the I channel component to the signal determination unit 232a-1 and outputs the signal of the Q channel component to the signal determination unit 232a-2.

The signal determination units 232a independently perform symbol determination with respect to the signal of the I channel component and the signal of the Q channel component, which are output from the IQ separation unit 235, to acquire L-value symbol sequences corresponding to the I channel component and the Q channel component. Specifically, the signal determination unit 232a-1 performs symbol determination with respect to the signal of the I channel component output from the IQ separation unit 235 to acquire an L-value symbol sequence corresponding to the I channel component. The signal determination unit 232a-1 outputs the acquired L-value symbol sequence corresponding to the I channel component to the signal decoding unit 233a-1. The signal determination unit 232a-2 performs symbol determination with respect to the signal of the Q channel component output from the IQ separation unit 235 to acquire an L-value symbol sequence corresponding to the Q channel component. The signal determination unit 232a-2 outputs the acquired L-value symbol sequence corresponding to the Q channel component to the signal decoding unit 233a-2.

The signal decoding units 233a restore M-value symbol sequences corresponding to the data information I and Q based on correspondence between the M-value symbol sequences and the L-value symbol sequences that are output from the signal determination units 232a and respectively correspond to the I channel component and the Q channel component. Specifically, the signal decoding unit 233a-1 restores an M-value symbol sequence corresponding to the data information I based on correspondence between the M-value symbol sequence corresponding to the I channel component and the L-value symbol sequence corresponding to the I channel component, which is output from the signal determination unit 232a-1. The signal decoding unit 233a-2 restores an M-value symbol sequence corresponding to the data information Q based on correspondence between the M-value symbol sequence corresponding to the Q channel component and the L-value symbol sequence corresponding to the Q channel component, which is output from the signal determination unit 232a-2.

A correspondence table is prepared with respect to correspondence between the L-value symbol sequence corresponding to the I channel component and the M-value symbol sequence corresponding to the I channel component. The correspondence table may be transmitted from the optical transmitter 10a to the optical receiver 20a in advance or may also be transmitted from the optical transmitter 10a together with the modulation signal.

Also, a correspondence table is prepared with respect to correspondence between the L-value symbol sequence corresponding to the Q channel component and the M-value symbol sequence corresponding to the Q channel component. The correspondence table may be transmitted from the optical transmitter 10a to the optical receiver 20a in advance or may also be transmitted from the optical transmitter 10a together with the modulation signal.

The optical transmission system 100a configured as described above can be applied to a QAM signal.

Fifth Embodiment

In the description of a fifth embodiment, a configuration in which error correction is used in the first to third embodiments will be described. FEC (Forward Error Correction) is used as the error correction. Note that here, a configuration of a case in which the error correction is applied to a PAM signal will be described.

In the present invention, non-linear block coding is used, and therefore there is a problem in that if even a single coded L-value symbol is mistaken, continuous errors may occur in an M-value symbol sequence before coding corresponding to that block. To avoid this problem, an optical transmitter performs error correction coding after performing non-linear coding, and an optical receiver performs non-linear decoding after performing error correction decoding. Here, the error correction code may be an error correction code that is based on hard decision information or an error correction code that is based on soft decision information.

Figure 10:
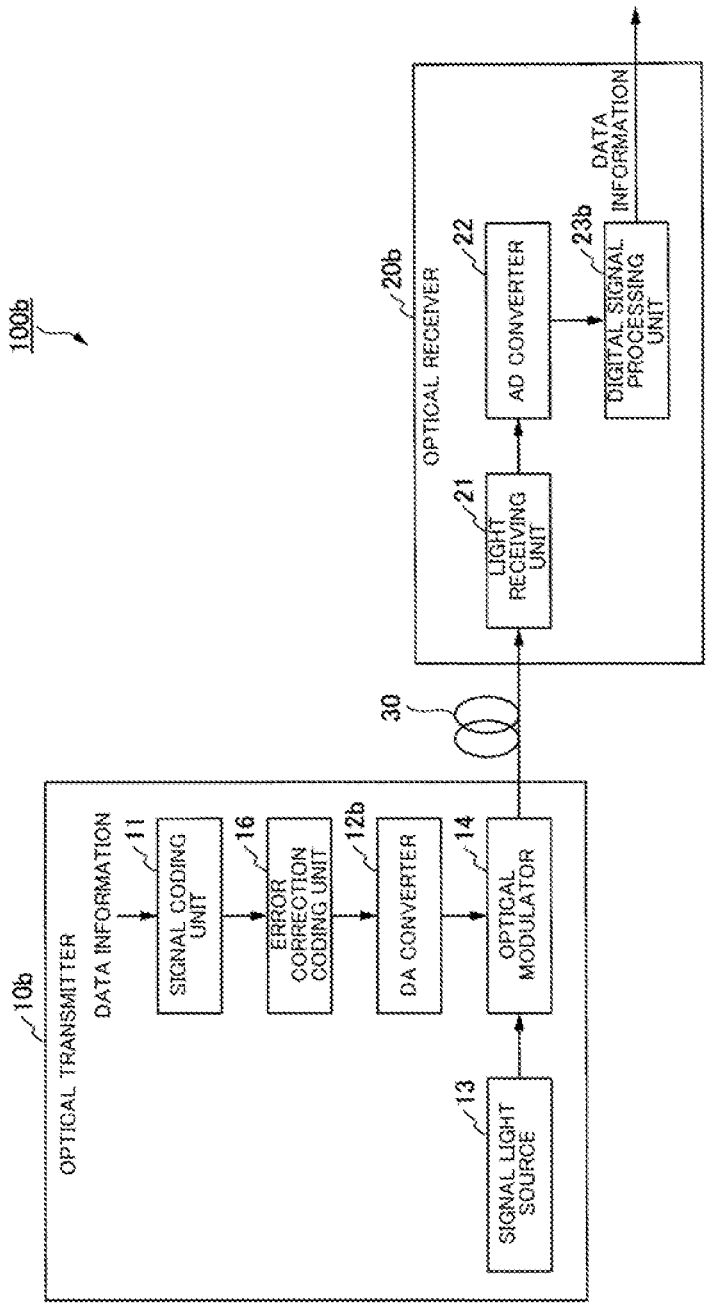
FIG. 10 is a diagram showing a system configuration of an optical transmission system in a fifth embodiment.

FIG. 10 is a diagram showing a system configuration of an optical transmission system 100b in the fifth embodiment. The optical transmission system 100b includes an optical transmitter 10b and an optical receiver 20b. The optical transmitter 10b and the optical receiver 20b are connected to each other via the optical fiber 30. The optical fiber 30 is a transmission path that connects the optical transmitter 10b and the optical receiver 20b.

The optical transmitter 10b includes the signal coding unit 11, a DA converter 12b, the signal light source 13, the optical modulator 14, and an error correction coding unit 16. Here, data information that is input to the optical transmitter 10b is M-value symbols before coding. In the optical transmitter 10b, configurations other than the DA converter 12b and the error correction coding unit 16 perform the same processing as that performed in the optical transmitter 10 in any of the first to third embodiments. The following only describes differences.

The error correction coding unit 16 performs error correction coding on a digital signal of an L-value symbol sequence generated by the signal coding unit 11. The error correction coding unit 16 outputs the digital signal of the L-value symbol sequence subjected to the error correction coding to the DA converter 12b.

The DA converter 12b converts the digital signal of the L-value symbol sequence subjected to the error correction coding, which is output from the error correction coding unit 16, to an analog signal. The DA converter 12b applies the analog signal to the optical modulator 14.

The optical receiver 20b includes the light receiving unit 21, the AD converter 22, and a digital signal processing unit 23b. In the optical receiver 20b, configurations other than the digital signal processing unit 23b perform the same processing as that performed in the optical receiver 20 in any of the first to third embodiments. The following only describes differences.

The digital signal processing unit 23b acquires M-value symbols before coding by processing a digital signal.

Figure 11:
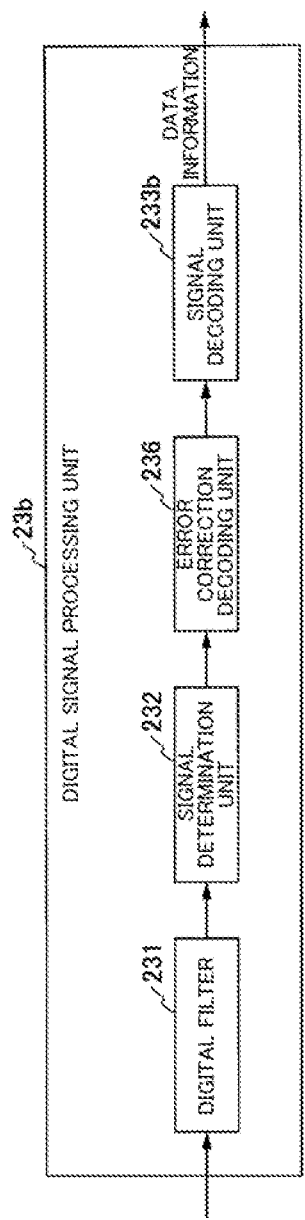
FIG. 11 is a diagram showing an internal configuration of a digital signal processing unit in the fifth embodiment.

FIG. 11 is a diagram showing an internal configuration of the digital signal processing unit 23b in the fifth embodiment.

The digital signal processing unit 23b includes the digital filter 231, the signal determination unit 232, a signal decoding unit 233b, and an error correction decoding unit 236. Descriptions of configurations of the digital filter 231 and the signal determination unit 232 in the digital signal processing unit 23b are omitted since the digital filter 231 and the signal determination unit 232 perform the same processing as that performed by the functional units of the same names in any of the first to third embodiments.

The error correction decoding unit 236 performs error correction decoding on an L-value symbol sequence output from the signal determination unit 232. The error correction decoding unit 236 outputs a digital signal of the L-value symbol sequence subjected to the error correction decoding to the signal decoding unit 233b.

The signal decoding unit 233b restores an M-value symbol sequence based on correspondence between the L-value symbol sequence that has been subjected to the error correction decoding and is output from the error correction decoding unit 236 and the M-value symbol sequence.

According to the optical transmission system 100b configured as described above, the optical transmitter 10b performs error correction coding after performing non-linear coding. The optical receiver 20b performs non-linear decoding after performing error correction decoding. If processing is performed as described above, it is possible to perform non-linear decoding after sufficiently reducing symbol errors that occur in L-value symbols during transmission. Therefore, the above-described optical transmission system 100b can avoid the occurrence of continuous errors due to non-linear block coding.

Sixth Embodiment

In the description of a sixth embodiment, a configuration in which error correction is used in the fourth embodiment will be described. Note that here, a configuration of a case in which the error correction is applied to a QAM signal will be described.

Figure 12:
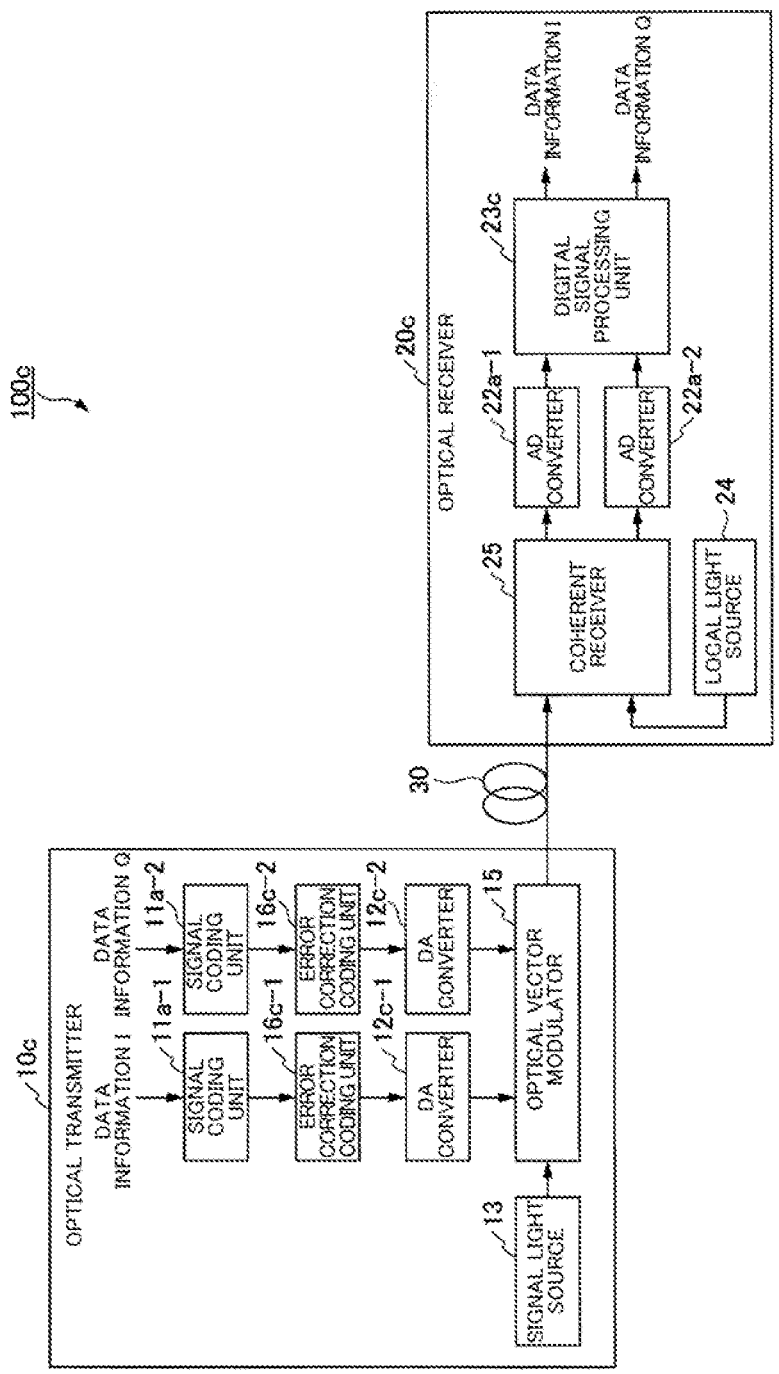
FIG. 12 is a diagram showing a system configuration of an optical transmission system in a sixth embodiment.

FIG. 12 is a diagram showing a system configuration of an optical transmission system 100c in the sixth embodiment. The optical transmission system 100c includes an optical transmitter 10c and an optical receiver 20c. The optical transmitter 10c and the optical receiver 20c are connected to each other via the optical fiber 30. The optical fiber 30 is a transmission path that connects the optical transmitter 10c and the optical receiver 20c.

The optical transmitter 10c includes the signal coding units 11a-1 and 11a-2, DA converts 12c-1 and 12c-2, the signal light source 13, the optical vector modulator 15, and error correction coding units 16c-1 and 16c-2. In the optical transmitter 10c, configurations other than the DA converters 12c-1 and 12c-2 and the error correction coding units 16c-1 and 16c-2 perform the same processing as that performed in the optical transmitter 10a in the fourth embodiment. The following only describes differences.

The error correction coding units 16c perform error correction coding on digital signals of L-value symbol sequences generated by the signal coding units 11a. Specifically, the error correction coding unit 16c-1 preforms error correction coding on a digital signal of an L-value symbol sequence that is generated by the signal coding unit 11a-1. The error correction coding unit 16c-1 outputs the digital signal of the L-value symbol sequence subjected to the error correction coding to the DA converter 12c-1. The error correction coding unit 16c-2 preforms error correction coding on a digital signal of an L-value symbol sequence that is generated by the signal coding unit 11a-2. The error correction coding unit 16c-2 outputs the digital signal of the L-value symbol sequence subjected to the error correction coding to the DA converter 12c-2.

The DA converters 12c convert the digital signals of the L-value symbol sequences that have been subjected to the error correction coding and are output from the error correction coding units 16c to analog signals. The DA converters 12c apply the analog signals to the optical vector modulator 15. Specifically, the DA converter 12c-1 converts the digital signal of the L-value symbol sequence that has been subjected to the error correction coding and is output from the error correction coding unit 16c-1, to an analog signal. The DA converter 12c-1 applies the analog signal to the optical vector modulator 15. The DA converter 12c-2 converts the digital signal of the L-value symbol sequence that has been subjected to the error correction coding and is output from the error correction coding unit 16c-2, to an analog signal. The DA converter 12c-2 applies the analog signal to the optical vector modulator 15.

The optical receiver 20c includes the AD converters 22a-1 and 22a-2, a digital signal processing unit 23c, the local light source 24, and the coherent receiver 25. In the optical receiver 20c, configurations other than the digital signal processing unit 23c perform the same processing as that performed in the optical receiver 20a in the fourth embodiment. The following only describes differences.

The digital signal processing unit 23c acquires M-value symbols before coding that correspond to data information I and Q by processing digital signals.

Figure 13:
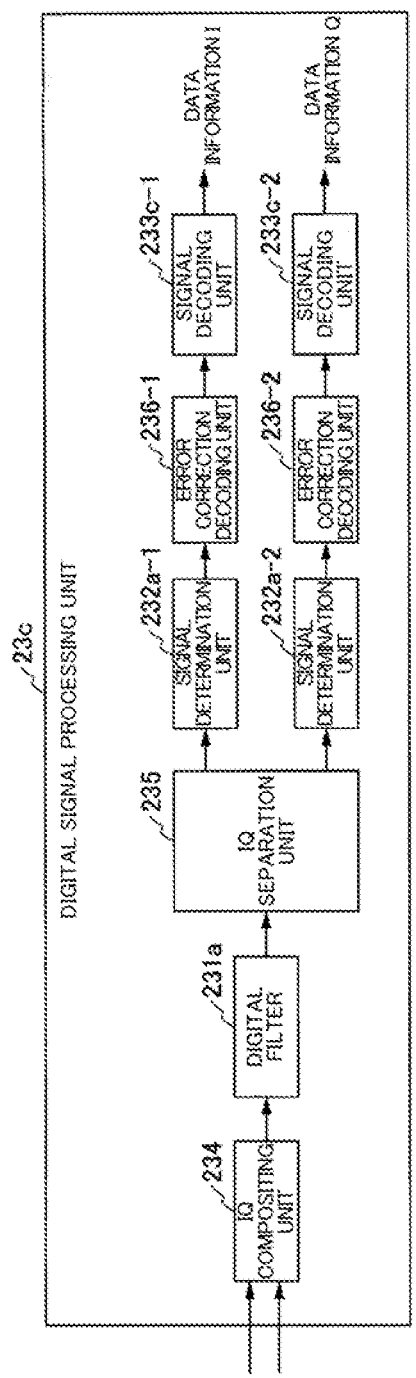
FIG. 13 is a diagram showing an internal configuration of a digital signal processing unit in the sixth embodiment.

FIG. 13 is a diagram showing an internal configuration of the digital signal processing unit 23c in the sixth embodiment.

The digital signal processing unit 23c includes the digital filter 231a, the signal determination units 232a-1 and 232a-2, signal decoding units 233c-1 and 233c-2, the IQ compositing unit 234, the IQ separation unit 235, and error correction decoding units 236-1 and 236-2. Descriptions of configurations of the digital filter 231a, the signal determination units 232a-1 and 232a-2, the IQ compositing unit 234, and the IQ separation unit 235 in the digital signal processing unit 23c are omitted since these units perform the same processing as that performed by the functional units of the same names in the fourth embodiment.

The error correction decoding units 236 perform error correction decoding on L-value symbol sequences output from the signal determination units 232a. Specifically, the error correction decoding unit 236-1 performs error correction decoding on an L-value symbol sequence that is output from the signal determination unit 232a-1. The error correction decoding unit 236-1 outputs a digital signal of the L-value symbol sequence subjected to the error correction decoding to the signal decoding unit 233c-1. The error correction decoding unit 236-2 performs error correction decoding on an L-value symbol sequence that is output from the signal determination unit 232a-2. The error correction decoding unit 236-2 outputs a digital signal of the L-value symbol sequence subjected to the error correction decoding to the signal decoding unit 233c-2.

The signal decoding units 233c restore M-value symbol sequences corresponding to the data information I and Q based on correspondence between the M-value symbol sequences and the L-value symbol sequences that are output from the signal determination units 232a and respectively correspond to the I channel component and the Q channel component. Specifically, the signal decoding unit 233c-1 restores an M-value symbol sequence corresponding to the data information I based on correspondence between the M-value symbol sequence corresponding to the I channel component and the L-value symbol sequence corresponding to the I channel component, which has been subjected to the error correction decoding and is output from the error correction decoding unit 236-1. The signal decoding unit 233c-2 restores an M-value symbol sequence corresponding to the data information Q based on correspondence between the M-value symbol sequence corresponding to the Q channel component and the L-value symbol sequence corresponding to the Q channel component, which has been subjected to the error correction decoding and is output from the error correction decoding unit 236-2.

In the optical transmission system 100c configured as described above, the optical transmitter 10c performs error correction coding after performing non-linear coding. Then, the optical receiver 20c performs non-linear decoding after performing error correction decoding. If processing is performed as described above, it is possible to perform non-linear decoding after sufficiently reducing symbol errors that occur in L-value symbols during transmission. Therefore, the occurrence of continuous errors due to non-linear block coding can be avoided in a case in which a QAM signal is used as well.

Seventh Embodiment

In the description of a seventh embodiment, a configuration in which MLSE (Maximum Likelihood Sequence Estimation) is used in the first to third embodiments will be described. Note that here, a configuration of a case in which maximum likelihood sequence estimation is applied to a PAM signal will be described.

In the above-described first to sixth embodiments, it is assumed that determination is performed for each symbol in signal demodulation that is performed with respect to an L-value symbol sequence. However, in the present invention, it is not essential to perform determination for each symbol. Accordingly, it is also possible to apply determination that is based on maximum likelihood sequence estimation as in the present embodiment.

Figure 14:
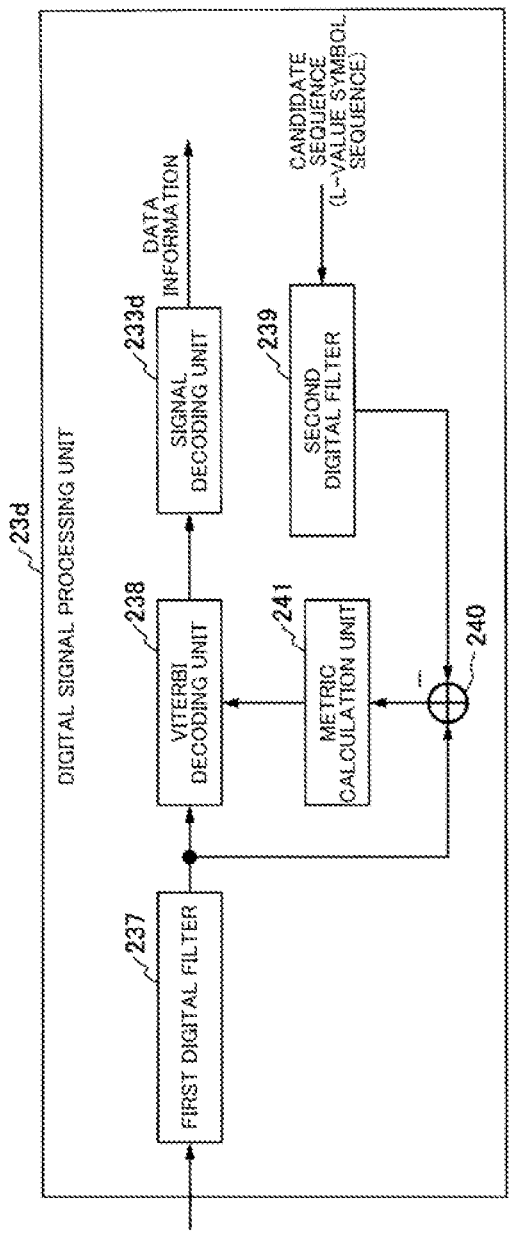
FIG. 14 is a diagram showing an internal configuration of a digital signal processing unit in a seventh embodiment.

FIG. 14 is a diagram showing an internal configuration of a digital signal processing unit 23d in the seventh embodiment.

The digital signal processing unit 23d includes a signal decoding unit 233d, a first digital filter 237, a Viterbi decoding unit 238, a second digital filter 239, an adder 240, and a metric calculation unit 241.

The first digital filter 237 performs waveform shaping on an L-value optical modulation signal. The first digital filter 237 is used to compensate for waveform deterioration of an L-value symbol sequence. The first digital filter 237 outputs the waveform-shaped L-value optical modulation signal to the Viterbi decoding unit 238 and the adder 240. A commonly used linear filter such as a FIR filter or a Volterra filter is used as the first digital filter 237.

The Viterbi decoding unit 238 performs sequence estimation based on the L-value optical modulation signal output from the first digital filter 237 and a metric that is output from the metric calculation unit 241. A representative algorithm for performing determination based on a metric value is a Viterbi algorithm. The Viterbi decoding unit 238 performs sequence estimation based on the Viterbi algorithm and adopts, as a transmission sequence, a symbol sequence that has the smallest metric among metrics that are obtained as a result of the sequence estimation.

The second digital filter 239 acquires time series data by performing digital filtering processing on a candidate sequence that is input. The candidate sequence is an L-value symbol sequence that is used to perform MLSE. The second digital filter 239 is for simulating waveform deterioration that occurs with respect to the candidate L-value symbol sequence in a transmission path. The second digital filter 239 outputs the acquired time series data to the adder 240. A commonly used linear filter such as a FIR filter or a Volterra filter is used as the second digital filter 239. In particular, a Volterra filter is preferably used as the second digital filter 239 in a system that has a large non-linear response.

The adder 240 takes the value output from the first digital filter 237 and the value output from the second digital filter 239. Note that the adder 240 gives the minus sign to the value output from the second digital filter 239 and takes that value. The adder 240 adds the two values, that is, reduces the value (time series data) output from the second digital filter 239 from the value (time series data) output from the first digital filter 237, and outputs the subtraction result obtained through the subtraction to the metric calculation unit 241.

The metric calculation unit 241 calculates, as a metric, the subtraction result output from the adder 240, that is, a Euclidean distance between the time series data that is obtained by performing digital filtering processing on a possible candidate (candidate sequence) for a sequence by using the second digital filter 239 and the time series data output from the first digital filter.

The signal decoding unit 233d restores an M-value symbol sequence based on correspondence between the transmission symbol sequence output from the Viterbi decoding unit 238 and the M-value symbol sequence.

Figure 15:
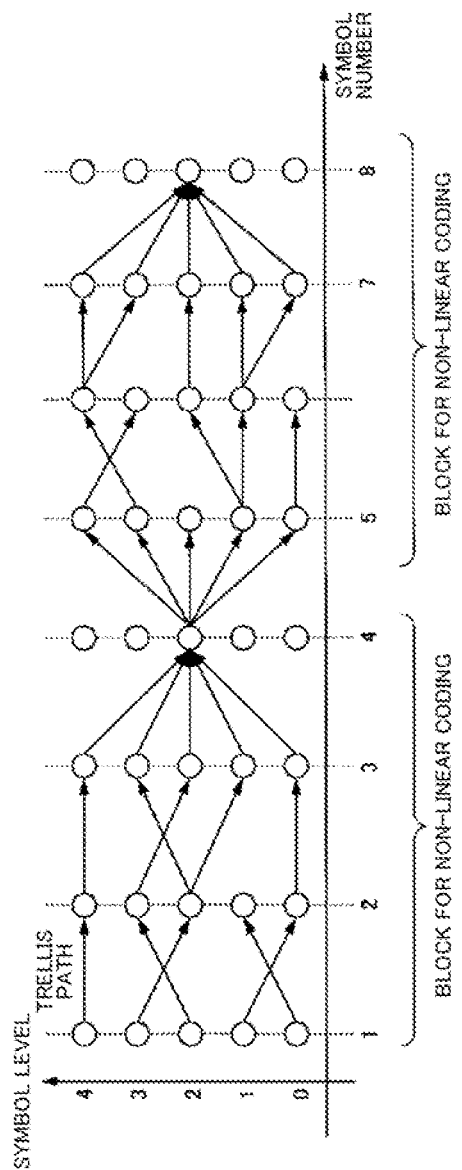
FIG. 15 is a diagram schematically showing a trellis diagram.

FIG. 15 is a diagram schematically showing a trellis diagram in a case in which values of end points are fixed. Here, N=4, L=5, and P=0. As shown in FIG. 15, trellis paths converge on a single point at end points of blocks (in FIG. 15, symbol Nos. 4 and 8), and therefore determination can be performed for each block with respect to four symbols constituting the block, and a result of determination of symbols of a block does not affect determination of symbols of another block.

The optical transmission system 100 according to the seventh embodiment configured as described above performs processing by applying maximum likelihood sequence estimation to a PAM signal. Specifically, MLSE is a method that corresponds to determination performed with respect to the whole sequence, and therefore it is possible to apply sequence estimation while considering an L-value symbol sequence subjected to non-linear coding as one block, that is, considering an L-value symbol sequence constituted by (N+P) symbols as one block. In particular, if only L-value symbol sequences in which the value of the first or the last symbol constituting a block is [(L−1)/2] or values of both the first symbol and the last symbol are [(L−1)/2] are assigned to M-value symbol sequences, first points and end points in a trellis diagram of MLSE are fixed. Therefore, it is possible to perform maximum likelihood sequence estimation for each block and make delay caused by symbol determination as short as possible.

(Variation)

In the description of the present embodiment, a configuration in which maximum likelihood sequence estimation is used in the first to third embodiments has been described. The configuration described in the present embodiment can also be applied to the fifth embodiment. In this case, the optical transmitter 10 in the fifth embodiment includes the error correction coding unit 16 and the digital signal processing unit 23d includes the error correction decoding unit 236.

Eighth Embodiment

In the description of an eighth embodiment, a configuration in which maximum likelihood sequence estimation is used in the fourth embodiment will be described. Note that here, a configuration of a case in which maximum likelihood sequence estimation is applied to a QAM signal will be described.

In the above-described first to sixth embodiments, it is assumed that determination is performed for each symbol in signal demodulation that is performed with respect to an L-value symbol sequence. However, in the present invention, it is not essential to perform determination for each symbol. Accordingly, it is also possible to apply determination that is based on maximum likelihood sequence estimation as in the present embodiment.

Figure 16:
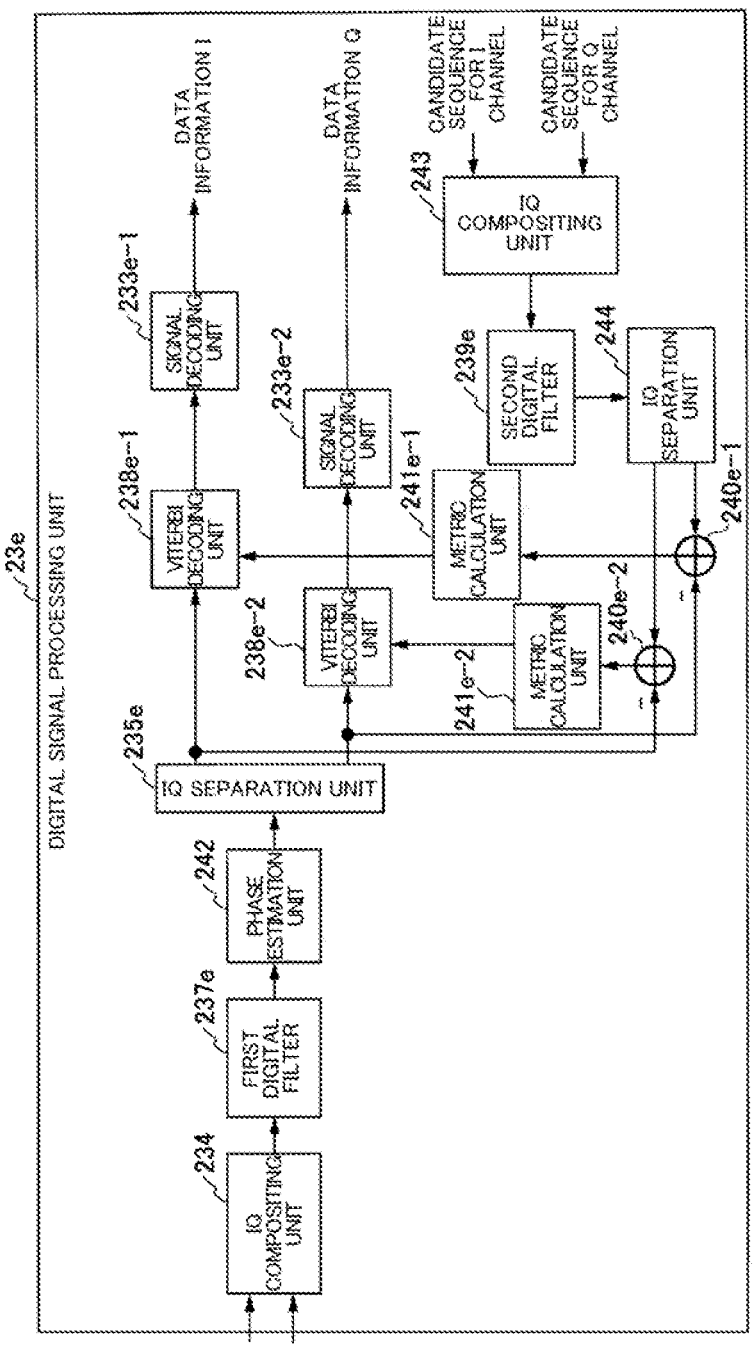
FIG. 16 is a diagram showing an internal configuration of a digital signal processing unit in an eighth embodiment.

FIG. 16 is a diagram showing an internal configuration of a digital signal processing unit 23e in the eighth embodiment.

The digital signal processing unit 23e includes signal decoding units 233e-1 and 233e-2, the IQ compositing unit 234, an IQ separation unit 235e, a first digital filter 237e, Viterbi decoding units 238e-1 and 238e-2, a second digital filter 239e, adders 240e-1 and 240e-2, metric calculation units 241e-1 and 241e-2, a phase estimation unit 242, an IQ compositing unit 243, and an IQ separation unit 244.

The IQ compositing unit 234 takes digital signals output from the AD converters 22a-1 and 22a-2 as a real part (a digital signal of an I channel component) and an imaginary part (a digital signal of a Q channel component), respectively. The IQ compositing unit 234 generates a complex signal by compositing these signals. Specifically, the IQ compositing unit 234 takes a digital signal output from the AD converter 22a-1 as the real part, takes a digital signal output from the AD converter 22a-2 as the imaginary part, and composites these signals to generate the complex signal.

The first digital filter 237e performs waveform shaping on an L-value optical modulation signal. The first digital filter 237e is used to compensate for waveform deterioration of an L-value symbol sequence. The first digital filter 237e outputs the waveform-shaped L-value optical modulation signal to the phase estimation unit 242. A commonly used linear filter such as a FIR filter or a Volterra filter is used as the first digital filter 237e.

The phase estimation unit 242 compensates for a phase difference between signal light and local light emitted from the local light source 24. The phase estimation unit 242 outputs the signal subjected to the compensation to the IQ separation unit 235.

The IQ separation unit 235e separates the signal output from the phase estimation unit 242 into the real part (I channel component) and the imaginary part (Q channel component). The IQ separation unit 235e outputs the signal of the I channel component to the Viterbi decoding unit 238e-1 and the adder 240e-2 and outputs the signal of the Q channel component to the Viterbi decoding unit 238e-2 and the adder 240e-1.

The Viterbi decoding units 238e perform sequence estimation based on the signal corresponding to the real part (I channel component) and the signal corresponding to the imaginary part (Q channel component), which are output from the IQ separation unit 235e, and metrics that are output from the metric calculation units 241e. Specifically, the Viterbi decoding unit 238e-1 performs sequence estimation of the I channel component based on the signal corresponding to the real part (I channel component) and a metric by using the Viterbi algorithm. The Viterbi decoding unit 238e-1 adopts, as a transmission sequence of the I channel component, a symbol sequence that has the smallest metric among metrics that are obtained as a result of the sequence estimation. The Viterbi decoding unit 238e-2 performs sequence estimation of the Q channel component based on the signal corresponding to the imaginary part (Q channel component) and a metric by using the Viterbi algorithm. The Viterbi decoding unit 238e-2 adopts, as a transmission sequence of the Q channel component, a symbol sequence that has the smallest metric among metrics that are obtained as a result of the sequence estimation.

The IQ compositing unit 243 generates a complex number by compositing a candidate sequence for the I channel component and a candidate sequence for the Q channel component, which are input. The candidate sequences in the present embodiment are an L-value symbol sequence corresponding to the I channel component and an L-value symbol sequence corresponding to the Q channel component, which are used to perform MLSE.

The second digital filter 239e acquires time series data by performing digital filtering processing on a composited candidate sequence generated by the IQ compositing unit 243. The second digital filter 239e is for simulating waveform deterioration that occurs with respect to the candidate L-value symbol sequence in a transmission path. The second digital filter 239e outputs the acquired time series data to the IQ separation unit 244. A commonly used linear filter such as a FIR filter or a Volterra filter is used as the second digital filter 239e. In particular, a Volterra filter is preferably used as the second digital filter 239e in a system that has a large non-linear response.

The IQ separation unit 244 separates the signal of the time series data output from the second digital filter 239e into the real part (I channel component) and the imaginary part (Q channel component). The IQ separation unit 244 outputs the signal of the I channel component to the adder 240-1 and outputs the signal of the Q channel component to the adder 240e-2.

The adder 240e-1 takes the value (signal of the Q channel component) output from the IQ separation unit 235e and the value (signal of the Q channel component) output from the IQ separation unit 244. Note that the adder 240e-1 gives the minus sign to the value output from the IQ separation unit 235e and takes that value. The adder 240e-1 adds the two values, that is, reduces the value output from the IQ separation unit 235e from the value output from the IQ separation unit 244, and outputs the subtraction result obtained through the subtraction to the metric calculation unit 241e-1.

The adder 240e-2 takes the value (signal of the I channel component) output from the IQ separation unit 235e and the value (signal of the I channel component) output from the IQ separation unit 244. Note that the adder 240e-2 gives the minus sign to the value output from the IQ separation unit 235e and takes that value. The adder 240e-2 adds the two values, that is, reduces the value output from the IQ separation unit 235e from the value output from the IQ separation unit 244, and outputs the subtraction result obtained through the subtraction to the metric calculation unit 241e-2.

The metric calculation unit 241e-1 calculates the subtraction result output from the adder 240e-1 as a metric.

The metric calculation unit 241e-2 calculates the subtraction result output from the adder 240e-2 as a metric.

The signal decoding units 233e restore M-value symbol sequences corresponding to data information I and Q based on correspondence between the M-value symbol sequences and L-value symbol sequences that are output from the Viterbi decoding units 238e and respectively correspond to the I channel component and the Q channel component. Specifically, the signal decoding unit 233e-1 restores an M-value symbol sequence corresponding to the data information I based on correspondence between the M-value symbol sequence corresponding to the I channel component and an L-value symbol sequence corresponding to the I channel component, which is output from the Viterbi decoding unit 238e-1. The signal decoding unit 233e-2 restores an M-value symbol sequence corresponding to the data information Q based on correspondence between the M-value symbol sequence corresponding to the Q channel component and an L-value symbol sequence corresponding to the Q channel component subjected to error correction decoding, which is output from the Viterbi decoding unit 238-2.

As described above, in the case of a QAM signal, it is possible to execute MLSE with respect to the I channel and the Q channel by applying the Viterbi algorithm to the signal of the I channel and the signal of the Q channel.

The optical transmission system 100 according to the eighth embodiment configured as described above performs processing by applying maximum likelihood sequence estimation to a QAM signal. Specifically, MLSE is a method that corresponds to determination performed with respect to the whole sequence, and therefore it is possible to apply sequence estimation while considering an L-value symbol sequence subjected to non-linear coding as one block, that is, considering an L-value symbol sequence constituted by (N+P) symbols as one block. In particular, if only L-value symbol sequences in which the value of the first or the last symbol constituting a block is [(L−1)/2] or values of both the first symbol and the last symbol are [(L−1)/2] are assigned to M-value symbol sequences, first points and end points in a trellis diagram of MLSE are fixed, and therefore it is possible to perform maximum likelihood sequence estimation for each block and make delay caused by symbol determination as short as possible.

(Variation)

In the description of the present embodiment, a configuration in which maximum likelihood sequence estimation is used in the fourth embodiment has been described, but the configuration described in the present embodiment can also be applied to the sixth embodiment. In this case, the optical transmitter 10c includes the error correction coding units 16c-1 and 16c-2 and the digital signal processing unit 23e includes 236-1 and 236-2.

Ninth Embodiment

In the first to eighth embodiments, cost values $\sigma^2$ are calculated for all of the $L^{(N+P)}$ symbol sequences that can be candidates for L-value symbol sequences after non-linear coding, and L-value symbol sequences are assigned to M-value symbol sequences in one-to-one correspondence in ascending order of the cost values. However, in the present invention, cost values do not necessarily have to be calculated for all candidates. In the description of a ninth embodiment, a method for executing non-linear coding by calculating cost values for a small number of candidates will be described.

Figure 17:
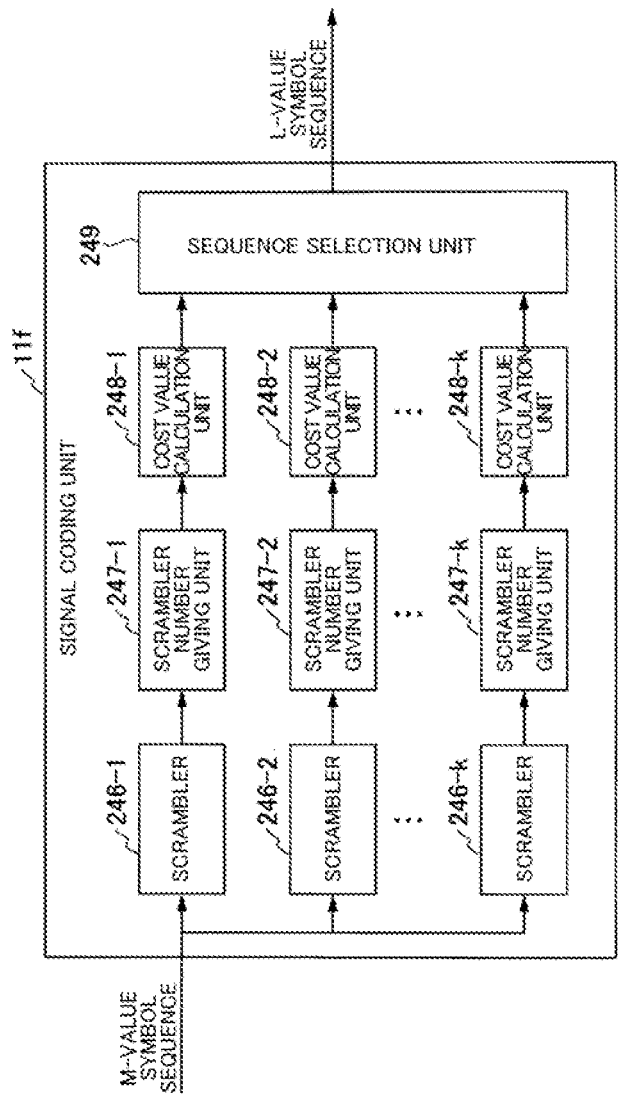
FIG. 17 is a diagram showing an internal configuration of a signal coding unit in a ninth embodiment.

FIG. 17 is a diagram showing an internal configuration of a signal coding unit 11f in the ninth embodiment.

The signal coding unit 11f includes scramblers 246-1 to 246-k (k is an integer greater than or equal to 2), scrambler number giving units 247-1 to 247-k, cost value calculation units 248-1 to 248-k, and a sequence selection unit 249. Note that in the present embodiment as well, each block of an M-value symbol sequence to which non-linear coding is applied is constituted by N M-value symbols.

In the following description, the scramblers 246-1 to 246-k will be referred to as scramblers 246 when the scramblers are not distinguished from each other. Also, in the following description, the scrambler number giving units 247-1 to 247-$k$ will be referred to as scrambler number giving units 247 when the scrambler number giving units are not distinguished from each other. Also, in the following description, the cost value calculation units 248-1 to 248-$k$ will be referred to as cost value calculation units 248 when the cost value calculation units are not distinguished from each other.

The scramblers 246 convert an M-value symbol sequence that is a symbol sequence before coding to L-value symbol sequences that are each constituted by N+P−1 L-value symbols. Here, scramble processing that is executed by the scramblers 246-1 to 246-$k$ is reversible conversion, and the scramblers execute the reversible conversion based on mutually different conversion rules. As a result, K different types of L-value symbol sequences are generated. An example of the reversible conversion executed by the scramblers 246 is conversion that is performed using an (N+P−1)×N matrix that has a pseudo inverse matrix.

The scrambler number giving units 247 give symbols that indicate scrambler numbers to the K types of L-value symbol sequences.

The cost value calculation units 248 calculate a cost value for each of the L-value symbol sequences constituted by (N+P) L-symbols.

The sequence selection unit 249 selects a sequence that has the smallest cost value from among the K types of L-value symbol sequences. The sequence selection unit 249 outputs the selected sequence as an output of the signal coding unit 11$f$.

Figure 18:
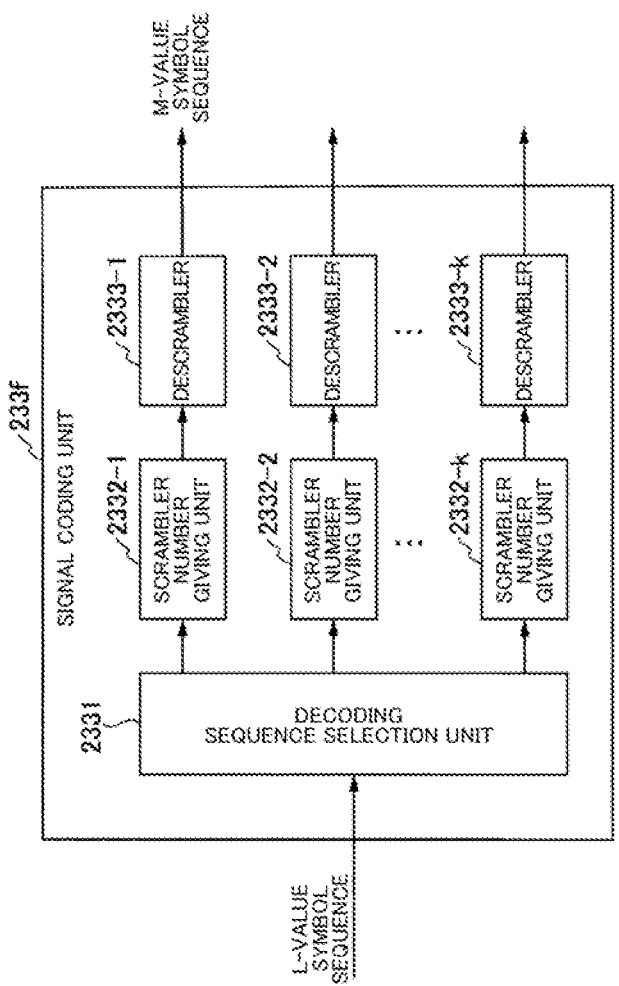
FIG. 18 is a diagram showing an internal configuration of a signal decoding unit in the ninth embodiment.

FIG. 18 is a diagram showing an internal configuration of a signal decoding unit 233$f$ in the ninth embodiment.

The signal decoding unit 233$f$ includes a decoding sequence selection unit 2331, scrambler number removing units 2332-1 to 2332-$k$, and descramblers 2333-1 to 2333-$k$.

In the following description, the scrambler number removing units 2332-1 to 2332-$k$ will be referred to as scrambler number removing units 2332 when the scrambler number removing units are not distinguished from each other. Also, in the following description, the descramblers 2333-1 to 2333-$k$ will be referred to as descramblers 2333 when the descramblers are not distinguished from each other.

The decoding sequence selection unit 2331 selects a destination to which a received L-value symbol sequence is to be output. Specifically, first, the decoding sequence selection unit 2331 checks a symbol indicating a scrambler number given to the L-value symbol sequence. Next, based on the check result, the decoding sequence selection unit 2331 identifies a scrambler that has performed coding processing on the L-value symbol sequence out of the K types of scramblers. Then, based on the identification result, the decoding sequence selection unit 2331 outputs the L-value symbol sequence to a scrambler number removing unit 2332 that corresponds to the L-value symbol sequence.

The scrambler number removing unit 2332 removes the symbol indicating the scrambler number from the L-value symbol sequence. The scrambler number removing unit 2332 outputs the L-value symbol sequence from which the symbol indicating the scrambler number has been removed to a descrambler 2333.

The descramblers 2333 use a descrambler according to the scrambler number checked in the decoding sequence selection unit 2331 to execute decoding processing that corresponds to reverse conversion of the coding processing performed by the scrambler and restore the M-value symbol sequence, which is the symbol sequence before coding.

An example of the reversible conversion executed by the scramblers 246 is conversion performed using an (N+P−1)×N matrix that has a pseudo inverse matrix. Block coding that is performed using such a matrix is reversible coding, and decoding can be performed by applying the pseudo inverse matrix using the descramblers 2333. Therefore, coding processing and decoding processing in the present embodiment can be executed using K different types of (N+P−1)×N matrices having pseudo inverse matrices, as the K types of scramblers. In the present embodiment, a coded symbol sequence is constituted by L-value symbols, and accordingly, calculation of a sum performed in a matrix operation is an operation of modulo L−1.

According to the optical transmission system 100 in the ninth embodiment configured as described above, the signal coding unit 11$f$ converts an M-value symbol sequence that is a symbol sequence before coding to L-value symbol sequences each constituted by N+P−1 L-value symbols. As described above, the signal coding unit 11$f$ need not calculate cost values $\sigma^2$ for all of the $L^{(N+P)}$ symbol sequences that can be candidates for L-value symbol sequences after non-linear coding in the ninth embodiment. Therefore, the amount of calculation can be reduced.

Tenth Embodiment

In the first to ninth embodiments, it is assumed that an L-value symbol sequence is generated from an M-value symbol sequence, but in the present invention, it is not essential to generate an L-value symbol sequence from an M-value symbol sequence. In the description of a tenth embodiment, a configuration in which an L-value symbol sequence is generated from a bit sequence will be described.

First, an overview of the tenth embodiment will be described.

Assume a bit sequence of which one block is constituted by J (J is an integer greater than or equal to 1) bits. The J bits are assigned to an L-value symbol sequence that is constituted by N symbols. At this time, $2^J$ L-value symbol sequences are extracted in ascending order of the cost value as described in the second embodiment or the third embodiment from among possible $L^N$ L-value symbol sequences, and each of the extracted L-value symbol sequences is assigned to J bits in one-to-one correspondence.

With this configuration, it is possible to directly generate an L-value symbol sequence from a bit sequence, rather than an M-value symbol sequence. That is, it is possible to generate an L-value symbol sequence by applying the above-described non-linear coding to a bit sequence. This is non-linear block coding for generating an L-value symbol sequence constituted by N symbols from a binary symbol sequence constituted by J symbols. In this method for directly generating an L-value symbol sequence from a bit sequence as well, cost values do not necessarily have to be calculated for all of the $L^N$ candidates for L-value symbol sequences. The following describes a specific configuration for realizing this method.

Figure 19:
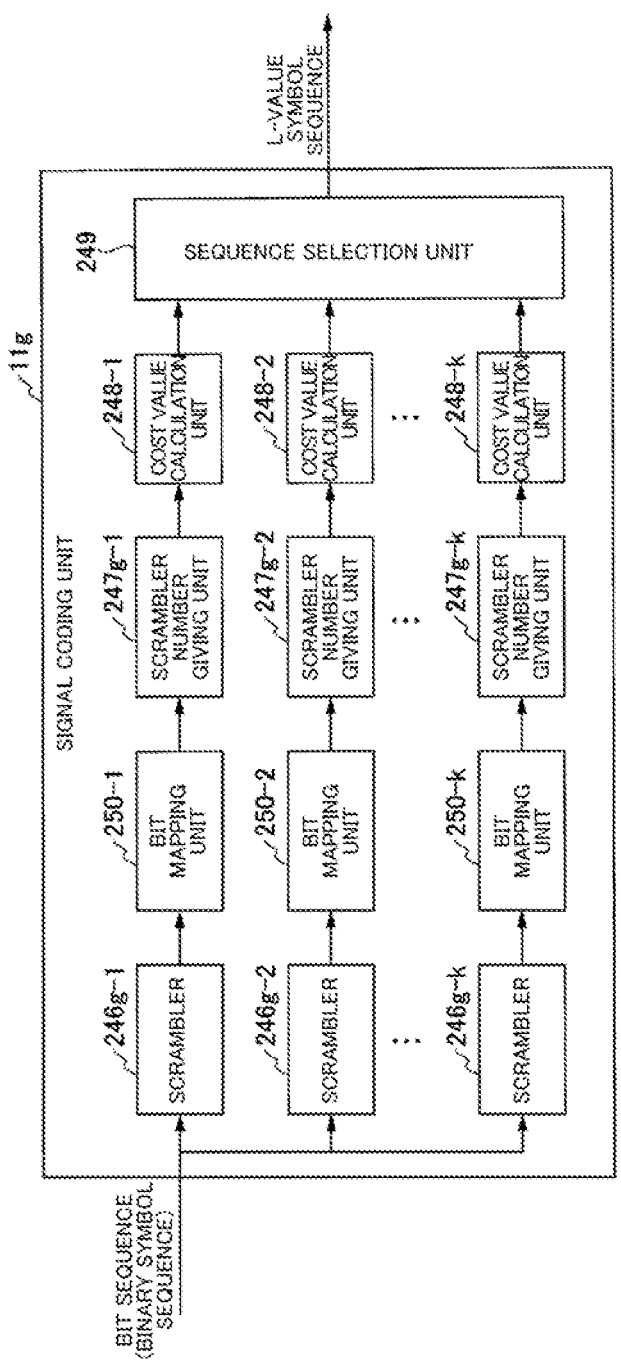
FIG. 19 is a diagram showing an internal configuration of a signal coding unit in a tenth embodiment.

FIG. 19 is a diagram showing an internal configuration of a signal coding unit 11$g$ in the tenth embodiment.

The signal coding unit 11$g$ includes scramblers 246$g$-1 to 246$g$-$k$, scrambler number giving units 247$g$-1 to 247$g$-$k$, cost value calculation units 248-1 to 248-$k$, the sequence selection unit 249, and bit mapping units 250-1 to 250-$k$.

In the following description, the scramblers 246g-1 to 246g-k will be referred to as scramblers 246g when the scramblers are not distinguished from each other. Also, in the following description, the scrambler number giving units 247g-1 to 247g-k will be referred to as scrambler number giving units 247g when the scrambler number giving units are not distinguished from each other. Also, in the following description, the bit mapping units 250-1 to 250-k will be referred to as bit mapping units 250 when the bit mapping units are not distinguished from each other.

A binary symbol sequence that is a symbol sequence before coding is input to the scramblers 246g. Different types of scramble processing are performed on the binary symbol sequence (bit sequence) before coding by the scramblers 246g-1 to 246g-k. Here, scramble processing that is executed by the scramblers 246g-1 to 246g-k is linear conversion for changing the order of J bits constituting the binary symbol sequence, and the scramblers 246g-1 to 246g-k execute the linear conversion based on mutually different rules for changing the order. As a result, K different types of bit sequences each constituted by J bits are generated.

The bit mapping units 250 convert the bit sequences to L-value symbol sequences that are each constituted by N—H L-value symbols.

The scrambler number giving units 247g give symbols that indicate scrambler numbers to the K types of L-value symbol sequences converted by the bit mapping units 250. Here, each scrambler number is indicated by H L-value symbols. Thus, K different types of L-value symbol sequences each constituted by N L-value symbols are generated.

Figure 20:
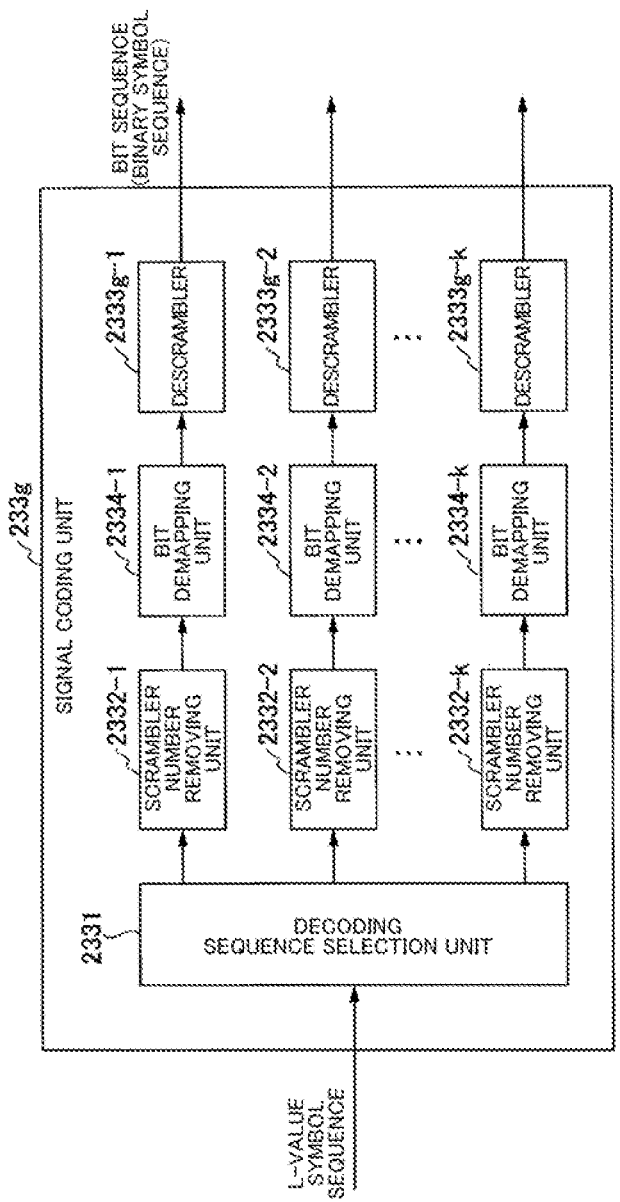
FIG. 20 is a diagram showing an internal configuration of a signal decoding unit in the tenth embodiment.

FIG. 20 is a diagram showing an internal configuration of a signal decoding unit 233g in the tenth embodiment.

The signal decoding unit 233g includes the decoding sequence selection unit 2331, scrambler number removing units 2332-1 to 2332-k, descramblers 2333g-1 to 2333g-k, and bit demapping units 2334-1 to 2334-k.

In the following description, the descramblers 2333g-1 to 2333g-k will be referred to as descramblers 2333g when the descramblers are not distinguished from each other. Also, in the following description, the bit demapping units 2334-1 to 2334-k will be referred to as bit demapping units 2334 when the bit demapping units are not distinguished from each other.

The bit demapping units 2334 perform demapping processing on L-value symbol sequences.

The descramblers 2333g use a descrambler according to a scrambler number checked in the decoding sequence selection unit 2331 to execute decoding processing that corresponds to reverse conversion of coding processing performed by a scrambler and restore the binary symbol sequence that is the symbol sequence before coding.

The following shows examples of linear conversion executed by the scramblers 246g and the descramblers 2333g, bit mapping performed by the bit mapping units 250, and bit demapping performed by the bit demapping units 2334. In the following description, J=8, L=4, N=7, and K=4. Linear conversion executed by the scramblers 246g-1 to 246g-4 is defined by matrices expressed by the following Expressions 1 to 4.

[Formula 4]

Scrambler 246g-1            Expression 4

$$\begin{pmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{pmatrix}$$

[Formula 5]

Scrambler 246g-2            Expression 5

$$\begin{pmatrix} 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \end{pmatrix}$$

[Formula 6]

Scrambler 246g-3            Expression 6

$$\begin{pmatrix} 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \end{pmatrix}$$

[Formula 7]

Scrambler 246g-4            Expression 7

$$\begin{pmatrix} 1 & 0 & 0 & 0 & 0 & 0 & 0 & 0 \\ 0 & 0 & 0 & 1 & 0 & 0 & 0 & 0 \\ 0 & 0 & 0 & 0 & 0 & 0 & 1 & 0 \\ 0 & 1 & 0 & 0 & 0 & 0 & 0 & 0 \\ 0 & 0 & 0 & 0 & 1 & 0 & 0 & 0 \\ 0 & 0 & 0 & 0 & 0 & 0 & 0 & 1 \\ 0 & 0 & 1 & 0 & 0 & 0 & 0 & 0 \\ 0 & 0 & 0 & 0 & 0 & 1 & 0 & 0 \end{pmatrix}$$

As a result of these matrices being applied to a bit sequence constituted by J bits, four types of bit sequences that differ from each other in the order of bits are obtained. The matrices are obtained by changing positions of a unit matrix and a row in the unit matrix a plurality of times. Each matrix is characterized in that a transposed matrix of the matrix is an inverse matrix, that is, $A^{-1}=A^t$. Therefore, if a matrix that corresponds to a transposed matrix of the matrix applied by a scrambler 246g is applied by a descrambler 2333g, it is possible to restore the bit sequence before subjected to the scramble processing by the scrambler 246g. Here, A represents the matrix applied by the scrambler 246g.

For example, if the bit sequence before coding is [10010111], outputs from the scramblers 246g are as follows.

Output from the scrambler 246g-1: [10010111], output from the scrambler 246g-2: [00101111], output from the scrambler 246g-3: [01011110], and output from the scrambler 246g-4: [11100101].

A conventional Gray code is applied as bit mapping executed by the bit mapping units 250. For example, values are assigned as follows: 00→0, 01→1, 11→2, 10→3. As a result of the bit mapping being applied, four-value symbol sequences each constituted by four symbols are generated. Four-value symbol sequences corresponding to the respective scramblers 246g are as follows.

Four-value symbol sequence corresponding to the scrambler 246g-1: 3112, four-value symbol sequence corresponding to the scrambler 246g-2: 0322, four-value symbol sequence corresponding to the scrambler 246g-3: 1123, and four-value symbol sequence corresponding to the scrambler 246g-4: 2311.

In bit demapping as well, each four-value symbol is converted to two bits based on the Gray code, and thus bit sequences can be restored from the four-value symbol sequences. Scrambler numbers are given to the four-value symbol sequences, which are outputs of the bit mapping. For example, a symbol corresponding to a scrambler number is added to the end of four-value symbols. For example, the following symbols may be given.
Symbol corresponding to the scrambler 246g-1: 0
Symbol corresponding to the scrambler 246g-2: 1
Symbol corresponding to the scrambler 246g-3: 2
Symbol corresponding to the scrambler 246g-4: 3

In addition, if 2 is added to both ends of symbols to suppress fluctuation between blocks, outputs from the scrambler number giving units 247g-1 to 247g-k are as follows.
Output corresponding to the scrambler 246g-1: 2031122, output corresponding to the scrambler 246g-2: 2103222, output corresponding to the scrambler 246g-3: 2211232, and output corresponding to the scrambler 246g-4: 2323112.

The cost value calculation units 248 calculate a cost value for each of these four-value symbol sequences. If the cost value expressed by Expression 2 is used, cost values of the outputs corresponding to the respective scramblers 246g are as follows, and it can be found that the output from the scrambler 246g-3 is the four-value symbol sequence having the smallest cost value. Thus, it is concluded that the output corresponding to the scrambler 246g-3 is the four-value symbol sequence having the smallest signal fluctuation. The sequence selection unit selects the output corresponding to the scrambler 246g-3, that is, [2211232] as a four-value symbol sequence to be transmitted.

Cost value of the output corresponding to the scrambler 246g-1: 56, cost value of the output corresponding to the scrambler 246g-2: 33, cost value of the output corresponding to the scrambler 246g-3: 7, and cost value of the output corresponding to the scrambler 246g-4: 22.

The signal decoding unit 233g of the optical receiver 20 checks the scrambler number given to the four-value symbol sequence. In this example, the received four-value symbol sequence is [2211232], and therefore the scrambler number is recognized as being 3 from the value 2 of the second symbol. The scrambler number removing unit 2332 removes the first two symbols and the last symbol added by the scrambler number giving unit 247g.

The thus obtained four-value symbol sequence is [1123]. The bit demapping unit 2334 converts the four-value symbols to binary symbols based on the Gray code. As a result, an eight-bit sequence [01011110] is obtained. A matrix expressed by the following Expression 8, which corresponds to a transposed matrix of the matrix applied by the scrambler 246g-3, is applied to this bit sequence by the descrambler 2333g-3 to obtain [10010111] that is the bit sequence before coding.

[Formula 8]

$$\begin{pmatrix} 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \end{pmatrix} \quad \text{Expression 8}$$

Figure 21:
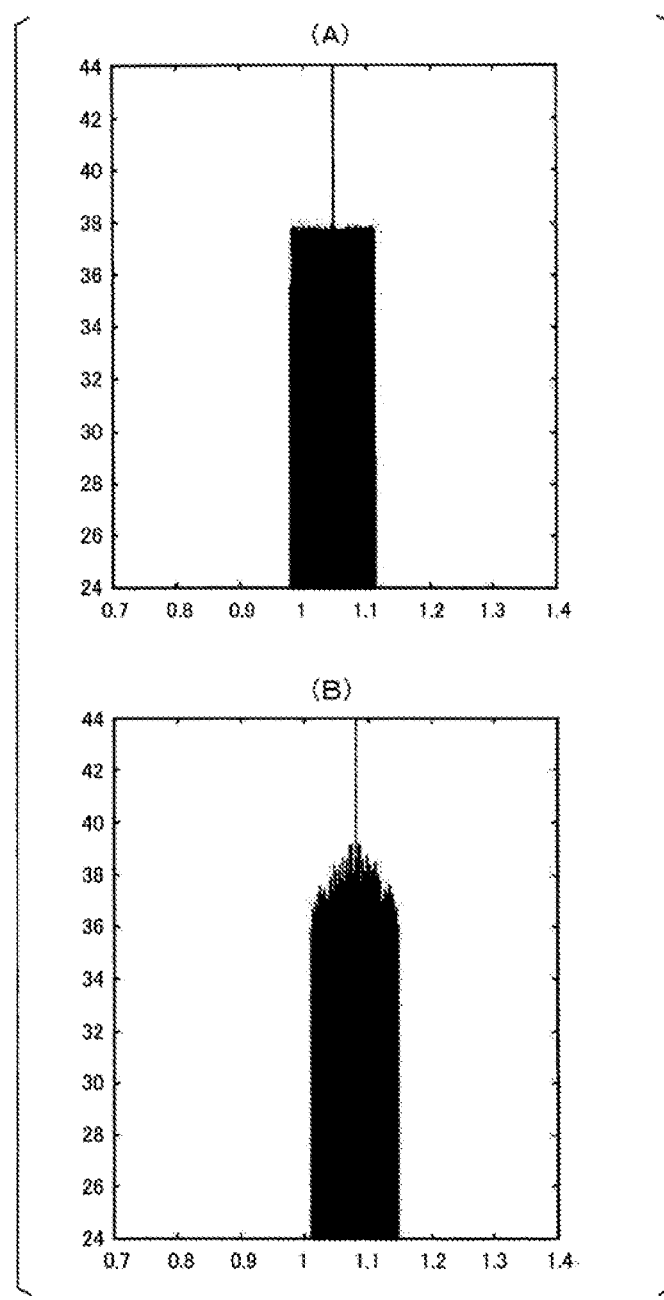
FIG. 21 is a diagram showing a signal spectrum corresponding to a four-value symbol sequence after non-linear coding and a signal spectrum of a PAM4 signal that corresponds to a conventional PAM4 signal and in which N=128.
Figure 22:
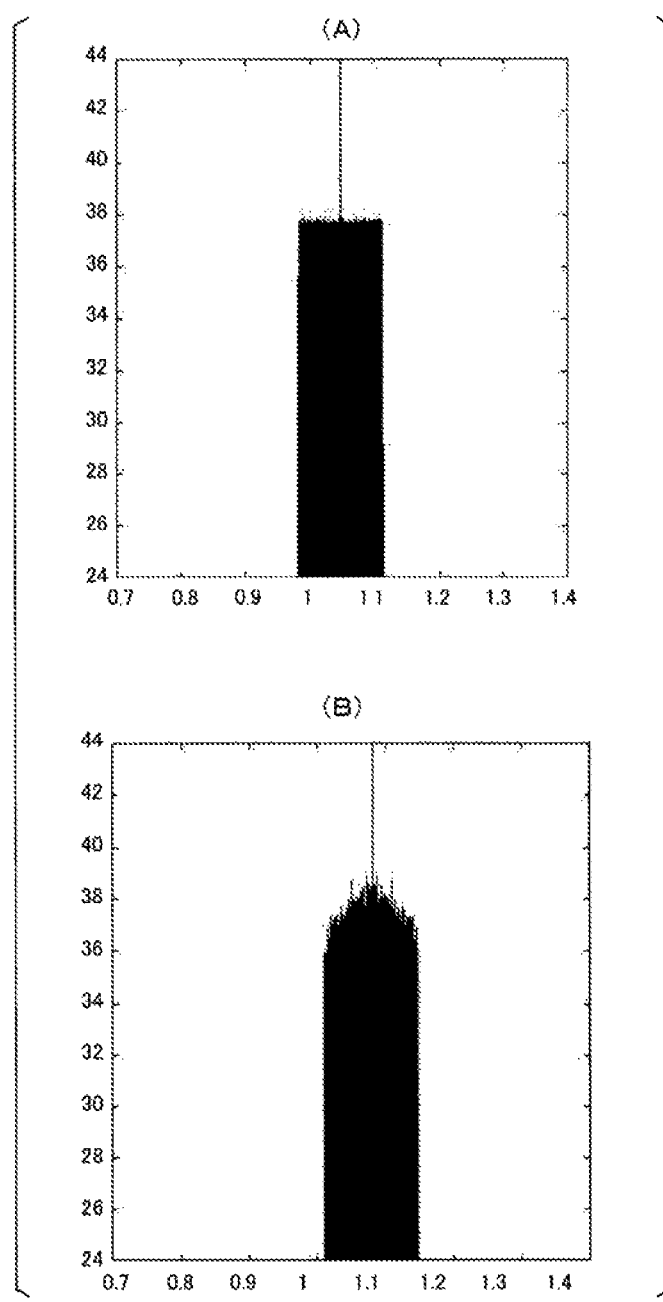
FIG. 22 is a diagram showing a signal spectrum corresponding to a four-value symbol sequence after non-linear coding and a signal spectrum of a PAM4 signal that corresponds to a conventional PAM4 signal and in which N=128.

FIGS. 21 and 22 are diagrams showing signal spectra corresponding to four-value symbol sequences after non-linear coding and signal spectra of PAM4 signals that correspond to conventional PAM4 signals and in which N=128. FIGS. 21(A) and 22(A) show signal spectra of four-value symbols before coding and FIGS. 21(B) and 22(B) show signal spectra of coded four-value symbols that are obtained through non-linear coding in the present invention. In FIGS. 21 and 22, the horizontal axis indicates the frequency and the vertical axis indicates the signal power.

Note that FIGS. 21 and 20 show cases where J=256, L=4, N=132, and K=16.

Here, a raised cosine filter having a roll-off factor of 0.01 is applied to the symbol sequences. The coding rate is 128/132=0.97, and redundancy added due to the coding is 3%. Expression 1 is used to calculate the cost value in FIG. 21 and Expression 2 is used to calculate the cost value in FIG. 22.

As shown in FIGS. 21(B) and 22(B), in the cases of the coded symbol sequences, the generation of high-frequency components is suppressed and the signal power is concentrated in a low-frequency region. That is, the signal spectrum bandwidth is narrowed. As a result of the signal spectrum bandwidth being narrowed, the influence of waveform deterioration due to band limitation and wavelength dispersion inherent in the optical transmission system is reduced.

The optical transmission system 100 in the ninth embodiment configured as described above can generate an L-value symbol sequence from a bit sequence. Therefore, even if data information is input as a bit sequence, processing in the above-described embodiments can be performed.

Some or all of the functions of the optical transmitters 10, 10a, 10b, and 10c and the optical receivers 20, 20a, 20b, and 20c in the above-described embodiments may be realized by a computer. In such a case, a program for realizing the functions may be recorded in a computer-readable recording medium, and the functions may be realized by loading the program recorded on this recording medium to a computer system, and executing the program. Note that the "computer system" used herein includes an OS and hardware such as peripheral devices. Also, the "computer-readable recording medium" refers to a portable medium such as a flexible disk, a magneto-optical disk, a ROM, or a CD-ROM, or a storage device built in the computer system, such as a hard disk. Furthermore, examples of the "computer-readable recording medium" include a medium that dynamically holds the program for a short period of time, like a communication line when transmitting the program through a network such as the Internet or a communication line such as a telephone line, and a medium that holds the program for a certain period of time like a volatile memory in a computer system that serves as a server or a client in that case. Also, the above-described program may be a program for realizing some of the aforementioned functions, a program that can realize the aforementioned functions in combination with a program that has already been recorded in the computer system, or a program that is realized using a programmable logic device such as a FPGA (Field Programmable Gate Array).

Although the embodiments of the present invention have been described in detail with reference to the drawings, specific configurations are not limited to these embodiments, and design or the like made without departing from gist of the present invention is also included in the scope of the present invention.

REFERENCE SIGNS LIST 10, 10a, 10b, 10c Optical transmitter
11, 11a-1, 11a-2, 11f, 11g Signal coding unit
12, 12b, 12a-1, 12a-2, 12c-1, 12c-2 DA converter
13 Signal light source
14 Optical modulator
15 Optical vector modulator
16, 16c-1, 16c-2 Error correction coding unit
20, 20a, 20b, 20c Optical receiver
21 Light receiving unit
22, 22a-1, 22a-2 AD converter
23, 23a, 23b, 23c, 23d Digital signal processing unit
24 Local light source
25 Coherent receiver
231, 231a Digital filter
232, 232a, 232a-1, 232a-2 Signal determination unit
233, 233a-1, 233a-2, 233b, 233c-1, 233c-2, 233d, 233e-1, 233e-2, 233f, 233g Signal decoding unit
2331 Decoding sequence selection unit
2332-1 to 2332-k Scrambler number removing unit
2333-1 to 2333-k, 2333g-1 to 2333g-k Descrambler
2334-1 to 2334-k Bit demapping unit
234 IQ compositing unit
235, 235e IQ separation unit
236, 236a-1, 236a-2 Error correction decoding unit
237, 237e First digital filter
238, 238e-1, 238e-2 Viterbi decoding unit
239, 239e Second digital filter
240, 240e-1, 240e-2 Adder
241, 241e-1, 241e-2 Metric calculation unit
242 Phase estimation unit
243 IQ compositing unit
244 IQ separation unit
246-1 to 246-k, 246g-1 to 246g-k Scrambler
247-1 to 247-k, 247g-1 to 247g-k Scrambler number giving unit
248-1 to 248-k Cost value calculation unit
249 Sequence selection unit
250-1 to 250-k Bit mapping unit

The invention claimed is:

1. An optical transmission system comprising: an optical transmitter; and an optical receiver, wherein the optical transmitter includes: a signal coding unit that performs non-linear block coding on an M-value symbol sequence to generate an L-value symbol sequence that corresponds to the M-value symbol sequence in one-to-one correspondence; a digital-to-analog conversion unit that converts the generated L-value symbol sequence to an analog signal; and a modulator that generates an optical modulation signal by performing modulation based on the analog signal, and the optical receiver includes: a light receiving unit that receives the optical modulation signal transmitted from the optical transmitter and converts the optical modulation signal to an electrical signal; and a signal decoding unit that restores the M-value symbol sequence by performing processing that is the reverse of processing performed by the signal coding unit, on the electrical signal, where M is an integer greater than or equal to 1, L is an integer greater than or equal to 2, and L>M.

2. The optical transmission system according to claim 1, wherein if an M-value symbol sequence that is constituted by N symbols is input, the signal coding unit assigns L-value symbol sequences to $M^N$ M-value symbol sequences in ascending order of a cost value, out of $L^{(N+P)}$ L-value symbol sequences are all or some of possible L-value symbol sequences, where N is an integer greater than or equal to 1 and P is an integer greater than or equal to 0.

3. The optical transmission system according to claim 2, wherein with respect to each of the $L^{(N+P)}$ L-value symbol sequences, the signal coding unit performs discrete Fourier transformation to acquire a signal spectrum of the L-value symbol sequence, and calculates, as the cost value, a signal spectrum breadth $\sigma^2$ based on the acquired signal spectrum by using the following $$\sigma^2 = \sum_{n=1}^{[(N+P)/2]} |F_n|^2 (n-1)^2 + \frac{1}{2}\left|F_{[\frac{(N+P)}{2}+1]}\right|^2 \left[\frac{(N+P)}{2}\right]^2$$

where F is numerical value sequence obtained by performing discrete Fourier transformation on the L-value symbol sequence.

4. The optical transmission system according to claim 1, wherein if an M-value symbol sequence that is constituted by N symbols is input, the signal coding unit assigns L-value symbol sequences to $M^N$ M-value symbol sequences in ascending order of a cost value, out of $L^{(N+P)}$ L-value symbol sequences that are all or some of possible L-value symbol sequences, the cost value being a signal spectrum breadth $\sigma^2$ that is calculated by using the following $$\sigma^2 = \sum_{n=3}^{N+P} |\Delta S_n - \Delta S_{n-1}|^2$$

$$\Delta S_n := S_n - S_{n-1}$$

where N is an integer greater than or equal to 1, P is an integer greater than or equal to 0, and S is a symbol in the L-value symbol sequence.

5. The optical transmission system according to claim 1, wherein the optical transmitter further includes an error correction coding unit that performs error correction coding after non-linear block coding, and the optical receiver further includes an error correction decoding unit that performs error correction decoding before non-linear block decoding.

6. The optical transmission system according to claim 1, wherein the optical receiver performs determination based on maximum likelihood sequence estimation in signal demodulation that is performed with respect to an L-value symbol sequence.

7. The optical transmission system according to claim 1, wherein the signal coding unit is constituted by: a plurality of scrambler units that generate K different types of L-value symbol sequences by converting the M-value symbol sequence to L-value symbol sequences that are each constituted by N+P−1 L-value symbols; a plurality of scrambler number giving units that give symbols indicating scrambler numbers to the K types of L-value symbol sequences; a plurality of cost value calculation units that calculate a cost value for each of the L-value symbol sequences; and a sequence selection unit that selects an L-value symbol sequence that has the smallest cost value from among the K types of L-value symbol sequences, and the signal decoding unit is constituted by: a plurality of scrambler number removing units that remove a symbol indicating a scrambler number from the L-value symbol sequence; and a plurality of descramblers that restore an M-value symbol sequence that is a symbol sequence before coding by executing decoding processing using a descrambler according to the scrambler number, the decoding processing corresponding to reverse conversion of coding processing performed by the scrambler units, where the M-value symbol sequence is constituted by N symbols, N is an integer greater than or equal to 1, the L-value symbol sequence is constituted by N+P symbols, and P is an integer greater than or equal to 0.

8. An optical transmission system comprising:
an optical transmitter; and an optical receiver, wherein the optical transmitter includes:
a signal coding unit that performs non-linear block coding on a M-value symbol sequence of bits to generate an L-value symbol sequence of bits that corresponds to the M-value symbol sequence of bits in one-to-one correspondence; such that each symbol in the M-value symbol sequence of bits is encoded using M values and each symbol in the L-value symbol sequence of bits is encoded using L values;
a digital-to-analog conversion unit that converts the generated L-value symbol sequence of bits to an analog signal; and
a modulator that generates an optical modulation signal by performing modulation based on the analog signal, and the optical receiver includes: a light receiving unit that receives the optical modulation signal transmitted from the optical transmitter and converts the optical modulation signal to an electrical signal; and a signal decoding unit that restores the M-value symbol sequence of bits by performing processing that is the reverse of processing performed by the signal coding unit, on the electrical signal, where M is an integer greater than or equal to 1, L is an integer greater than or equal to 2, and L>M.

* * * * *